United States Patent
Wedowski

(10) Patent No.: US 7,154,666 B2
(45) Date of Patent: Dec. 26, 2006

(54) NARROW-BAND SPECTRAL FILTER AND THE USE THEREOF

(75) Inventor: Marco Wedowski, Aalen (DE)

(73) Assignee: Carl Zeiss SMT AG (DE)

(*) Notice: Subject to any disclaimer, the term of this patent is extended or adjusted under 35 U.S.C. 154(b) by 94 days.

(21) Appl. No.: 10/466,961

(22) PCT Filed: Jan. 25, 2002

(86) PCT No.: PCT/EP02/00762

§ 371 (c)(1),
(2), (4) Date: Jul. 23, 2003

(87) PCT Pub. No.: WO02/059905

PCT Pub. Date: Aug. 1, 2002

(65) Prior Publication Data

US 2004/0061930 A1   Apr. 1, 2004

(30) Foreign Application Priority Data

Jan. 26, 2001 (DE) .................. 101 03 738
Feb. 26, 2001 (DE) .................. 101 09 242
Jul. 19, 2001 (DE) .................. 101 36 620

(51) Int. Cl.
    *G02B 5/20* (2006.01)
(52) U.S. Cl. ............ 359/360; 359/359; 359/361
(58) Field of Classification Search ........ 359/359, 359/360, 361, 350, 577, 580, 582, 585, 588, 359/589, 885, 892; 428/620, 641, 660, 662, 428/663

See application file for complete search history.

(56) References Cited

U.S. PATENT DOCUMENTS 4,870,648 A * 9/1989 Ceglio et al. .................. 372/5
5,182,670 A   1/1993 Khan et al. .................. 359/359

(Continued)

FOREIGN PATENT DOCUMENTS

DE         44 10 275         10/1994

(Continued)

OTHER PUBLICATIONS

Molybdenum-silicon Multilayer Monochromator for the Extreme Ultraviolet, T. T.W. Barbee, Jr, et al, Applied Physics Letters 50 (25), Jun. 22, 1987, XP-002202201.

(Continued)

*Primary Examiner*—Arnel C. Lavarias
(74) *Attorney, Agent, or Firm*—Hudak, Shunk & Farine Co. LPA

(57) ABSTRACT

The invention relates to a narrow-band spectral filter. The aim of the invention is to reduce the radiation exposure of optical elements used in highly ultraviolet light by using an optical filter that is simple in construction and that preselects a wavelength band of a predetermined bandwidth. To this end, an optical filter is provided that comprises at least one zirconium, niobium, or molybdenum layer interposed between two silicon layers. In order to increase the mechanical stability and the service life of the filter and in order to further restrict the spectral characteristics, another two ruthenium or rhodium layers each can follow the silicon layers. The filters of this kind are especially used in illumination systems and projection illumination systems for highly ultraviolet light that are used in semiconductor lithography.

59 Claims, 23 Drawing Sheets

U.S. PATENT DOCUMENTS

| | | | | |
|---|---|---|---|---|
| 5,581,605 | A | * | 12/1996 | Murakami et al. ............. 378/84 |
| 5,965,065 | A | * | 10/1999 | Powell ........................ 252/582 |
| 5,978,134 | A | | 11/1999 | Chaton et al. .............. 359/360 |
| 6,013,399 | A | | 1/2000 | Nguyen ........................ 430/5 |
| 6,153,044 | A | * | 11/2000 | Klebanoff et al. ....... 156/345.3 |
| 6,228,512 | B1 | * | 5/2001 | Bajt et al. .................... 428/635 |

FOREIGN PATENT DOCUMENTS

| | | |
|---|---|---|
| DE | 199 48 240 | 8/2000 |
| DE | 101 00 265 | 7/2002 |
| EP | 267 655 | 5/1988 |
| EP | 860 492 | 8/1998 |
| EP | 1 150 139 | 10/2001 |
| JP | 63008703 | 1/1988 |
| JP | 2053002 | 2/1990 |
| WO | WO 00/41875 | 7/2000 |

OTHER PUBLICATIONS

Filter Windows for EUV Lithography, F.R. Powell et al, Emerging Lithographic Technologies V, Elisabeth A. Dobisz, Editor, Proceedings of SPIE vol. 4343, pp. 585-598 (2001).

* cited by examiner

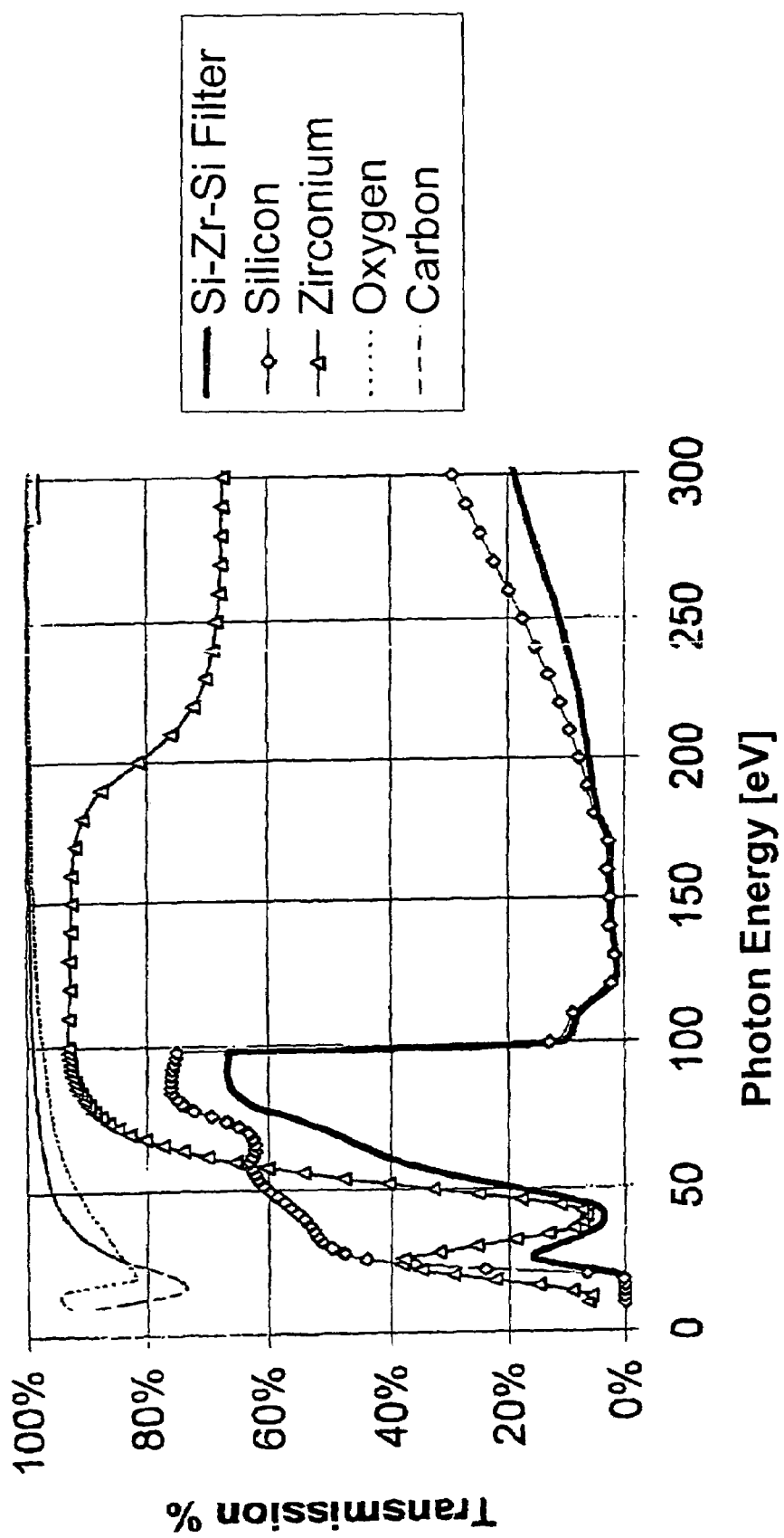

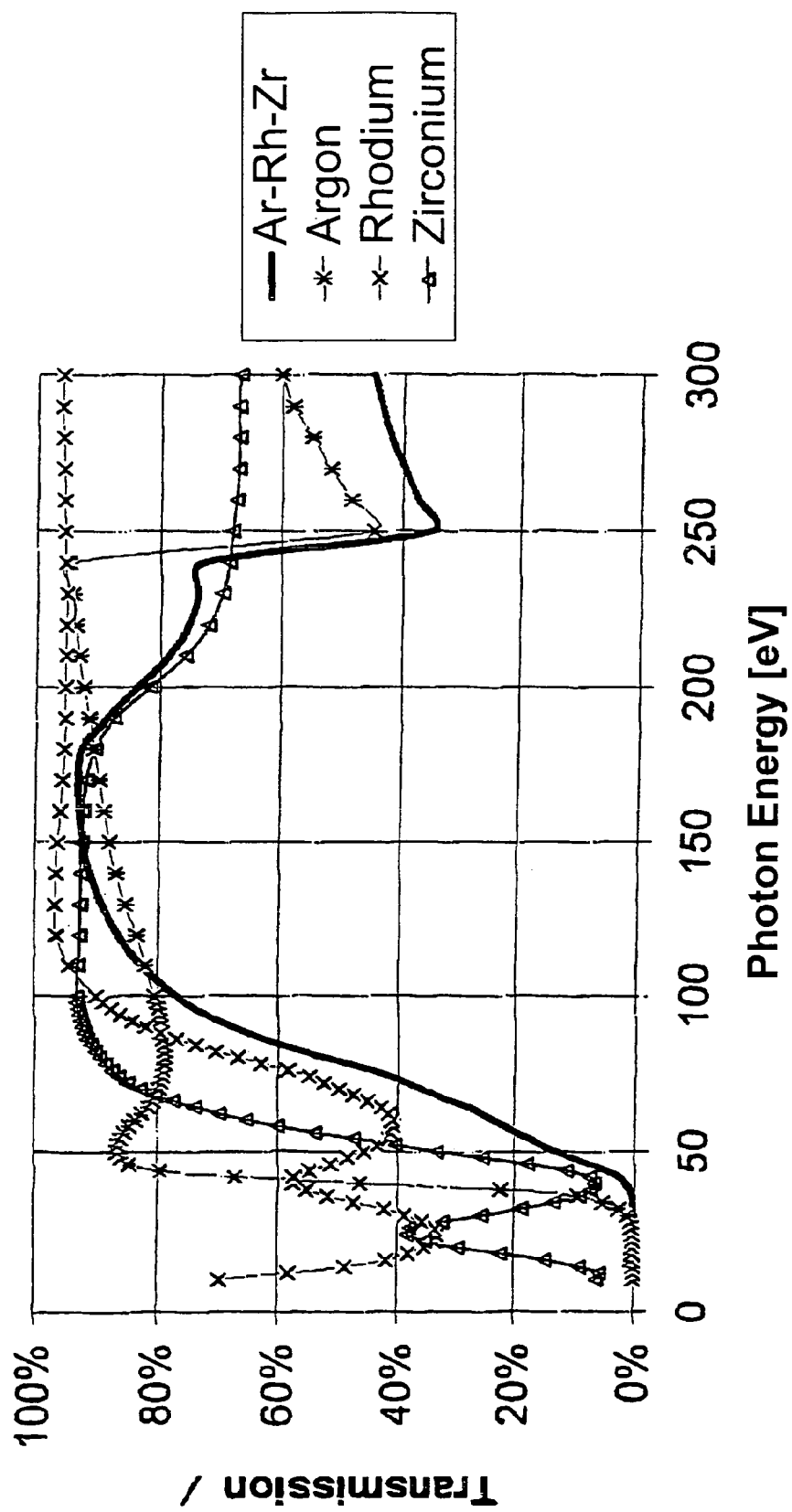

NARROW-BAND SPECTRAL FILTER AND THE USE THEREOF

FIELD OF THE INVENTION

The invention relates to an optical filter for the extreme ultraviolet wavelength range as well as the use thereof.

BACKGROUND OF THE INVENTION

Extreme ultraviolet light (EUV light) will in the future be used more extensively in mass production lithography for manufacturing semiconductor structures and components with structure sizes of less than 70 nm. For this purpose, radiation with a wavelength of approximately 13 nm, in particular, will be used. For the operation of the respective production systems, narrow-band spectral filters with sufficient service life will be needed. These are necessary, since all sources of extreme ultraviolet light known to the art up to now have a very low degree of efficiency which is expressed, on the one hand, in a high heat load and in debris, and, on the other hand, in a large and undesirable share of radiation outside of the radiation band needed for lithography with extreme ultraviolet light. Debris here is understood as any material, e.g. ceramic materials or metals, which, due to the high input of energy for the generation of the extreme ultraviolet light, is finely pulverized and then deposited on the optical elements and, for example, in the lithographic chamber in the form of a layer. By using a filter as separator between the radiation source and the lithographic apparatus, the debris can be kept out of the lithographic apparatus, as described in the WO 00/41875. It is only necessary to exchange the filter when the debris has accumulated on the filter to a degree that transmission is no longer sufficient.

Optical filters for the infrared, the visible, and also the ultraviolet wavelength range have been known to the art for a long time. As a rule, this involves the equipment of transparent substrates with a layer having a wavelength-dependent transmission rate, i.e. the transmission, starting from a particular wavelength, increases or decreases at a steep angle. Layers with this type of transmission edges are often used as optical low-pass filter layers, since they only allow light to pass from a particular wavelength on or within a particular wavelength range.

Particularly for the ultraviolet wavelength range, various filters used, for example, in sunglasses or in sun beds are known to the art.

For example, from the application EP 0 267 655 A2, a filter is known to the art which is manufactured of foil of synthetic material with UV-absorbing pigments, wherein the foil of synthetic material is transparent at 320 to 400 nm and absorbs at 290 to 320 nm, so that only the relatively harmless UVA radiation is allowed to pass.

From U.S. Pat. No. 5,182,670, a narrow-band filter for ultraviolet light comprising at least two $Al_xGa_{(l-x)}N$ layers with differing aluminum content and optional thickness is known to the art. By varying the aluminum content, the energy gap of this semiconductor is changed, and thereby the wavelength of the transmitting light in the range of 270 to 365 nm. By combining at least two layers, transmission and reflection can be tuned to fit the system.

With the low-pass filter for the UV range described in U.S. Pat. No. 5,978,134, the plasmone frequency of metal is used as limit frequency for the reflection. For this purpose, earthy base or alkali metals are used above all. Furthermore, an interference system of MgO or $Al_2O_3$ and $MgF_2$, or of $Al_2O_3$ and $SiO_2$ may be applied on the low-pass filter. The application DE 44 10 275 A1 discloses a thin-layer band pass filter for the ultraviolet wavelength range which is transparent at 320 to 430 nm. The filter edge is implemented by an absorption edge of the material of a thin layer, and the spectral position thereof is established by adjusting the composition of the material of the thin layer. In this process, one component of the material generates an absorption edge above the desired spectral position, the other component, an absorption edge below the desired spectral position. Preferred materials are oxides, fluorides, sulfides, and oxinitrides of metals, in particular, $Ta_2O_5$, $Nb_2O_5$, $TaO_xN_y$, $HfO_xN_y$, $ZrO_xN_y$, $TiO_2$, and ZnS. Particularly preferred are $Nb_2O_5/Ta_2O_5$ single layers with a thickness of between 53.8 nm and 85 nm on $SiO_2$ layers of 53 to 138 nm thickness. These layer systems have repeat factors of between 1 and 5, in order to make it possible to utilize, in addition, interference effects.

In the extreme ultraviolet wavelength range, reflecting multi-layer systems, particularly those composed of molybdenum and silicon layers, are used. These have the disadvantage that their production is very complicated and cost-intensive. Therefore, these types of mirrors have to be protected against undesirable spectral shares in order to decrease the radiation load and thereby to increase the service life. This requirement is reinforced by the fact that the mirrors reflect radiation with photon energies of <10 eV with undesirably high efficiency. Furthermore, the contamination by debris also very quickly makes the mirror unusable. This means that very high costs and high standstill times are incurred which are unacceptable for the use of the EUV lithography for mass production.

SUMMARY OF THE INVENTION

This invention therefore has the object of providing an optical filter of simple structure which preselects a wavelength band of a particular width for the use of EUV radiation sources before further optical elements, such as for example, mirrors. Furthermore, the invention has the object of showing applications for a filter of this type.

This object is achieved by an optical filter for the extreme ultraviolet wavelength range which is characterized by at least two silicon layers between which at least one zirconium layer is interposed. According to another alternative, the object is achieved by a filter characterized by at least two silicon layers between which at least one niobium or molybdenum layer is interposed. Furthermore, the object is achieved by applications according to claims 24 through 26.

In order to obtain maximum transmission in the extreme ultraviolet wavelength range, particularly in an energy band around 92 eV, and maximum absorption outside of this band, the filtering properties of the materials zirconium and silicon are combined which both have an absorption edge in the area of 92 eV. The use of zirconium in the filter causes the transmission to considerably decrease toward lower photon energies. The use of silicon, on the contrary, causes the transmission to considerably decrease toward higher photon energies. Since, in addition, the zirconium is interposed between two silicon layers, the oxidation of the zirconium is effectively prevented, which leads to a longer service life of the filter.

It is notable that a relatively narrow spectral characteristic of the optical filter is obtained, although only the absorption effects of the filter layers are utilized.

Up to now, zirconium has been known primarily as structural raw material in the chemical industry or as alloying component in steel and non-ferrous metals. According to U.S. Pat. No. 6,013,399, zirconium serves, among others, as component of a mask for the EUV lithography and functions as reflective layer. The general state of the art within the inventors company has been, up to now, the idea that the use of zirconium in transmitting optical elements for the EUV range has to fail, on the one hand, because of the quick oxidation of the zirconium, and on the other hand, because of the required thinness. In an optical context, $ZrO_2$ as dielectric in interference systems (see DE 44 10 275 A1) or zirconium phosphate, for example, in phosphorescence screens for X-rays, as described in the application EP 0 860 492 A1, are better known to the art. $ZrO_2$ is also used as protective layer against the oxidation of substrates (see for example, EP 0 588 038 B1).

After filtering the incoming radiation, e.g. the radiation from a synchrotron radiation source, through the filter according to the invention, narrow-band radiation with high intensity becomes available. For the purpose of higher intensity, the bandwidth is greater than the band pass of the subsequent optical elements, such as for example Mo/Si mirrors, but a restriction to the extreme ultraviolet spectral range does occur already. In particular, the shares are reduced to almost zero in the visible (VIS), in the ultraviolet (UV), and in the deep ultraviolet (DUV) parts.

The filter according to the invention can also be used as protection against debris. For this purpose, the filter according to the invention should, for example, be disposed as final element of the EUV radiation source, so that any debris is stopped and prevented from being deposited on the subsequent optical elements.

Preferably, the silicon layers are thicker than the zirconium layer. This embodiment has the advantage that the photons are absorbed at a comparable rate toward higher energies as toward lower energies.

Preferably, the thickness of the zirconium layer is in the range of 1 nm to 1,000 nm, particularly preferred, in the range of 5 nm to 100 nm.

Advantageously, the following ratios should be adhered to for the selection of the layer thickness of zirconium and silicon:

$dSi=1-e^{-k \cdot dZr}$ with dSi silicon layer thickness (in μm)
dZr zirconium layer thickness (in nm)
and $0.001 \leq k \leq 0.005$ (in 1/nm).

The best results for the application in EUV lithography with regard to the transmission profile as well as with regard to the mechanical stability were obtained with silicon layers in thicknesses of between 50 and 100 nm, preferably between 70 and 90 nm, and a zirconium layer thickness of between 10 and 40 nm, preferably between 20 and 30 nm.

For radiation sources of very pronounced brilliancy, such as synchrotron radiation sources, however, it may be necessary to use filters with a zirconium layer of a thickness of some 100 nm and silicon layers in thicknesses of several 100 nm, preferably Si 700–900 nm, Zr 400–600 nm, in particular, 800 nm Si/500 nm Zr/800 nm Si for a filter with approximately 1% transmission.

In order to achieve maximum transmission in the extreme ultraviolet wavelength range, particularly in an energy band around 92 eV, and maximum absorption outside of this band, the filter properties of the materials niobium or molybdenum and silicon are combined.

The use of niobium or molybdenum in the filter causes the transmission to considerably decrease toward lower photon energies. The use of silicon in the filter, on the contrary, causes the transmission to considerably decrease toward higher photon energies.

Preferably, the thickness of the niobium or molybdenum layer is in the range of 1 nm to 1,000 nm, particularly preferably, in the range of 5 nm to 100 nm.

Advantageously, the following ratios should be adhered to for the selection of the layer thickness of niobium and silicon:

$dSi=1-e^{-k \cdot dNb}$ with dSi silicon layer thickness (in μm)
dNb niobium layer thickness (in nm)
and $0.001 \leq k \leq 0.005$ (in 1/nm).

or for molybdenum and silicon, respectively:

$dSi=1-e^{-k \cdot dMo}$ with dSi silicon layer thickness (in μm)
dZr molybdenum layer thickness (in nm)
and $0.001 \leq k \leq 0.005$ (in 1/nm).

The silicon layers are preferably thicker than the niobium or molybdenum layer so that the photons are absorbed at a comparable rate toward higher energies as toward lower energies. Since furthermore, niobium or molybdenum is interposed between two silicon layers, the oxidation of the niobium or molybdenum is effectively prevented, which provides the filter with a longer service life.

The best results for the application in the EUV lithography with regard to the transmission profile as well as with regard to the mechanical stability were obtained with silicon layers of a thickness between 50 and 100 nm, preferably 70 and 90 nm, and a niobium or molybdenum layer thickness of between 10 and 40 nm, preferably 20 and 30 nm.

For radiation sources of very pronounced brilliancy, such as synchrotron radiation sources, however, it may be necessary to use filters with a niobium or molybdenum layer of a thickness of some 100 nm and silicon layers in thicknesses of several 100 nm, e.g. 700–900 nm (Si)/400–600 nm (Nb or Mo)/700–900 nm (Si), in particular, 800 nm (Si)/500 nm (Nb or Mo)/800 nm (Si) for a filter with 1% transmission.

In a preferred embodiment, the at least three layers are self-supporting. It has become apparent that the optical filter according to the invention obtains sufficient mechanical stability from the at least three layers for most thickness/width ratios, so that maximum dimensions on the filter plane, e.g. diameter, of between 1 cm and 4 cm are possible.

For special applications, however, it has proven to be advantageous to install the at least three layers on a support structure. This is important, in particular, when the filter is subjected to extraordinary mechanical loads or when filters with, for example, large diameters or widths/lengths are requested wherein the increase of the layer thicknesses would—with comparable mechanical stability—lead to a higher reduction of transmission than a support structure would cause. As support structures, mesh-shaped structures, e.g. made of nickel, have proven to be particularly suitable. For filters with support structure, maximum dimensions on the plane of between 8 cm and 14 cm can be obtained.

The optical filter may be installed as a whole on the support structure. The support structure, however, may also be interposed between two layers of the optical filter. Accordingly, the support structure can be interposed within one of the at least three layers, 1a (zirconium), 1b (niobium), 2 (silicon) described herein.

It may be advantageous for the optical filter to be equipped with an additional layer on at least one side, wherein the additional layer has a protective function without substantially influencing the maximum transmission of the optical filter. Simultaneously, however, a spectral constriction can be achieved. These protective layers may be formed, for example, by deposits of, in particular, carbon and oxygen from the atmosphere and lengthen the service life of the optical filter. The protective layers may also be specifically installed on the optical filter. In this context, layer thicknesses of between 0.1 nm and 100 nm, in particular, 1 nm and 50 nm, are recommended. It is possible to use all methods for preventing the contamination of silicon layers known to the art for the optical filter, as well. In this case, a service life of >10,000 h can be expected.

Particularly preferred are optical filters having a ruthenium layer or a rhodium layer on at least one side. Advantageously, these layers have a thickness of between 0.1 nm and 100 nm, in particular, 1 nm and 50 nm, preferably, between 1 nm and 20 nm. These protective layers not only increase the mechanical stability of the filter, but also the service life of the filter in the case of radiation with, in particular, extreme ultraviolet radiation, since the oxidation by oxygen, in particular, is prevented. Not only the ruthenium, but also the rhodium layers, in addition, influence the spectral characteristic of the filter by causing the suppression of the spectral area between approximately 50 eV and 80 eV. This leads to a narrower spectral characteristic of the filter with a small loss of maximum transmission of the filter (approximately 10%).

It has also proven advantageous to equip the filter on at least one side with a protective layer containing boron, carbon, nitrogen, and/or oxygen, or compounds thereof, such as hydrocarbons, oxides, carbides, nitrides, borides, SiC, BN, BCN, $B_4C$, etc., which hereinafter will be abbreviated as "BCNO". Preferably, it has a thickness of between 0.1 nm and 100 nm, particularly preferably, between 1 nm and 50 nm. It may be specifically installed, e.g. as outermost layer, during manufacture of the optical filter. The at least one protective layer increases not only the mechanical and thermal stability, but also the service life of the filter and prevents the oxidation of the filter surface due to oxygen from the atmosphere.

Whether the filter has a ruthenium, rhodium, or "BCNO" layer on one or on both sides, is decided on the basis of the environment in which the filter is used and on the basis of the influences to which the respective side is exposed.

It has proven advantageous to provide a diffusion barrier layer between an external layer of this type, in particular between the ruthenium or rhodium layer, and the silicon layer. This diffusion barrier layer preferably contains boron, carbon, nitrogen, and/or oxygen in a compound individually or in combination. It is particularly preferable to compose this layer of "BCNO", in particular, of silicon carbide (SiC), boron nitride (BN), boron carbonitride (BCN), or boron carbide ($B_4C$). This diffusion barrier serves the purpose of preventing the diffusion of the silicon, in particular, into the ruthenium or rhodium layer, where it is changed into a ruthenium or rhodium silicon alloy, which could negatively affect the filtering properties and the service life of the optical filter. Since the proposed diffusion barrier materials absorb very little in the extreme ultraviolet wavelength range, their effect on the spectral characteristic of the filter is negligible.

The materials nitrogen and oxygen may be applied by exposing the filter for a preselected time to a suitable gas, e.g. a nitrogen/oxygen atmosphere, before installing the protective layer.

If the silicon layer is briefly brought into contact with the atmosphere, a silicon dioxide layer with a thickness of no more than 1.5 nm is generated. The thickness can be adjusted within a range of between 0.1 and 1.5 nm, preferably between 0.5 nm and 1 nm, with the aid of the time period during which the silicon layer is exposed to the atmosphere. The advantage of the silicon oxide layer lies in the fact that the production thereof is clearly simpler and more economical than the application of other materials.

Preferably, the diffusion barriers have a thickness of between 0.1 nm and 50 nm, preferably 1 nm and 10 nm. This further improves the mechanical stability of the filter, as well. An additional enhancement of the filtering effect of the filter according to the invention can be obtained by filling the surroundings of the optical EUV components with a gas, in particular, Ar. The filling pressure is preferably between 0.1 and $10^{-8}$ mbar.

The general layer sequence resulting from the investigation is (with alternatives in parentheses): (Ru, Rh)/Si/(Zr, Nb, Mo)/Si/(Ru, Rh)/(with "BCNO" as protective layer and/or diffusion barrier at the boundary surfaces). A filter of this type may be located in a gas, preferably in an Ar gas which participates in the filtering process, which means that this could also be called a gas layer, in particular, an (Ar) layer. Depending on the application, one or several of the listed components may be omitted or interchanged. The optimal filtering effect and service life, however, become possible by, in particular, the suitable combination of the greatest number possible of components in the above described sequence.

The invention also relates to an optical apparatus with a path of rays for the EUV wavelength range, in particular, to a lithography device for the semiconductor component production, wherein the path of rays has at least one filter according to the invention. In order to be able to fully utilize the filtering effect of a gas, the apparatus is designed in such a way that it can be operated with a defined gas atmosphere at a defined pressure. Preferably, at least the filter is located within the apparatus in a gas atmosphere, preferably in an Ar atmosphere, at a pressure of $10^{-2}$–$10^{-7}$ mbar. Preferred pressures are $10^{-3}$–$10^{-7}$ and in particular, $10^{-5}$ mbar.

Preferably, the filter according to the invention can be used in illumination systems or in projection illumination systems for EUV light, in particular, for lithography for the semiconductor component production. These may be conventional systems, but also innovative systems, such as for example those described for the illumination system in the application DE 199 48 240.3 or, for example, for the projection system described in the application DE 101 00 265.3. The optical filter is advantageously placed in positions with small beam cross sections, but outside of beam waists and focal points. Preferably, it serves not only for the spectral constriction of the beam, but also for the vacuum-based separation of the EUV source and the lighting optics, or the projection optics and the resist-coated wafer. Aside from the application in lithography devices for the mass production of semiconductor elements, the filter can also be used in EUV measuring instruments firmly installed on lithography devices or kept available as mobile units for general tests on EUV devices. Use of the filter in stationary units for component tests of optical EUV components is also possible, as well as in EUV development and/or demonstration devices for process development.

Since the filter according to the invention is composed of easily available and relatively economical materials and can be manufactured without great cost by conventional coating techniques, since no particular manufacturing tolerances have to be complied with, the filter is suitable for applications in mass production lithography.

BRIEF DESCRIPTION OF THE DRAWINGS

The invention is explained in more detail with reference to several embodiments below:

| | |
|---|---|
|
FIGS. 1a–c: | show the spectral characteristics of the individual layers and of the filters composed thereof; |
|
FIGS. 8a–d: | show the spectral characteristics of the individual layers and of the filters composed thereof. |

DETAILED DESCRIPTION OF THE INVENTION

A first test filter was prepared, comprising a 30 nm thick zirconium layer interposed between silicon layers of 80 nm thickness each. Upon contact with the atmosphere, approximately 1.4 nm thick oxide layers as well as 0.5 nm thick carbon layers are deposited on both filter sides, during which process the oxygen has reacted with silicon to become silicon oxide. Since the zirconium layer is enclosed by the silicon layers, it is not oxidized by the attacking oxygen. The filter has a diameter of 10 mm and is mechanically so stable that it withstood several transports by mail and the repeated handling in various laboratories without harm.

A second filter was also prepared, comprising, in addition to the silicon and zirconium layers of the first test filter, a rhodium layer of 5 nm thickness on the external sides of both silicon layers. Upon contact with the atmosphere, only carbon-containing layers of a thickness of approximately 0.5 nm are deposited on both sides because of the low oxidation of rhodium.

Since investigations have shown that the optical properties of rhodium and ruthenium are very similar in the extreme ultraviolet wavelength range, particularly around 92 eV, a test filter with rhodium layers was selected as representative filter. The respective data are valid for filters with ruthenium layers, as well.

FIG. 1a shows the spectral characteristics of the individual materials silicon, zirconium, oxygen, and carbon in the above indicated thicknesses. Furthermore, the spectral characteristic of the resulting filter (Si—Zr—Si) is shown. As can be seen in FIG. 1, the transmission of zirconium considerably decreases starting from approximately 70 eV toward lower photon energies. The transmission of silicon, on the other hand, considerably decreases starting from 92 eV toward higher photon energies.

The transmission of the oxygen layer is approximately constant in the relevant area around 92 eV (corresponds to 13 nm). The fact that the oxygen oxidizes the silicon has no effect on the transmission; the important factor is only the number of the atoms being present. The transmission of the carbon layer is a constant 1 in an initial approximation. The spectral influence of the thin, natural oxide as well as of the carbon layer thus is very small. These layers, however, have a positive influence on the service life of the optical filter in the atmosphere as well as in the vacuum under EUV radiation. The filter has the effect that a transmission of more than 60% exists for the energy band around 92 eV. Below 50 eV and above 100 eV, the transmission is clearly under 10%. Only above 250 eV does the transmission rise again above 10%. But since none of the sources known today and useable as light source for the EUV lithography shows notable flows in this energy range, this fact is not very significant.

Figure 1B:
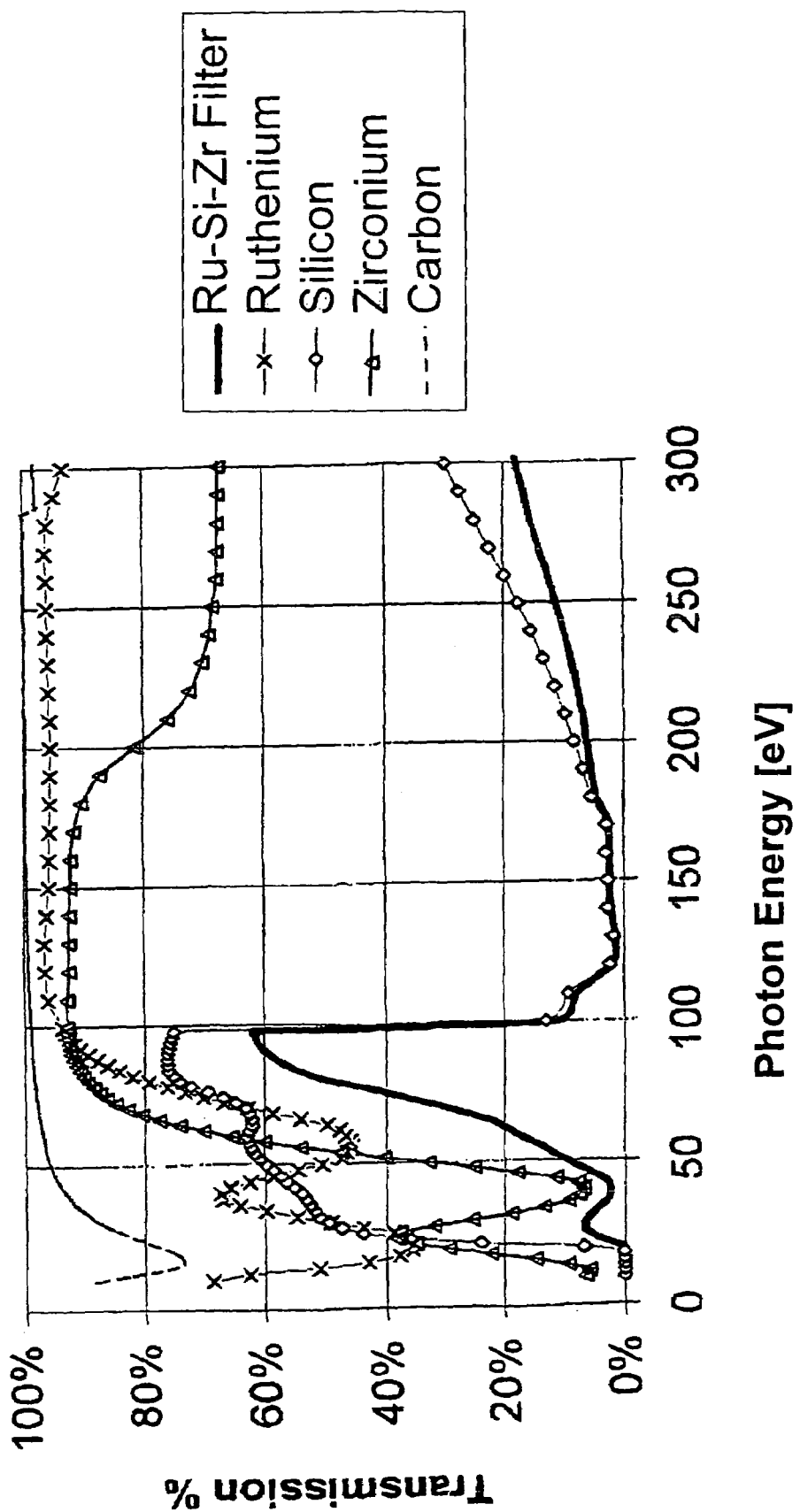

In FIG. 1b, instead of the spectral characteristic of oxygen, the spectral characteristic of ruthenium is plotted and, in addition, the spectral characteristic of the resulting filter (Ru—Si—Zr—Si—Ru). Due to the lesser oxidation of the ruthenium, only carbon-containing layers are formed on the filter surfaces. For the price of a reduced transmission amounting to a maximum of approximately 55%, a narrower spectral characteristic is obtained. The transmission in the range between 50 eV and 80 eV is clearly reduced in comparison to the first test filter.

Figure 1C:
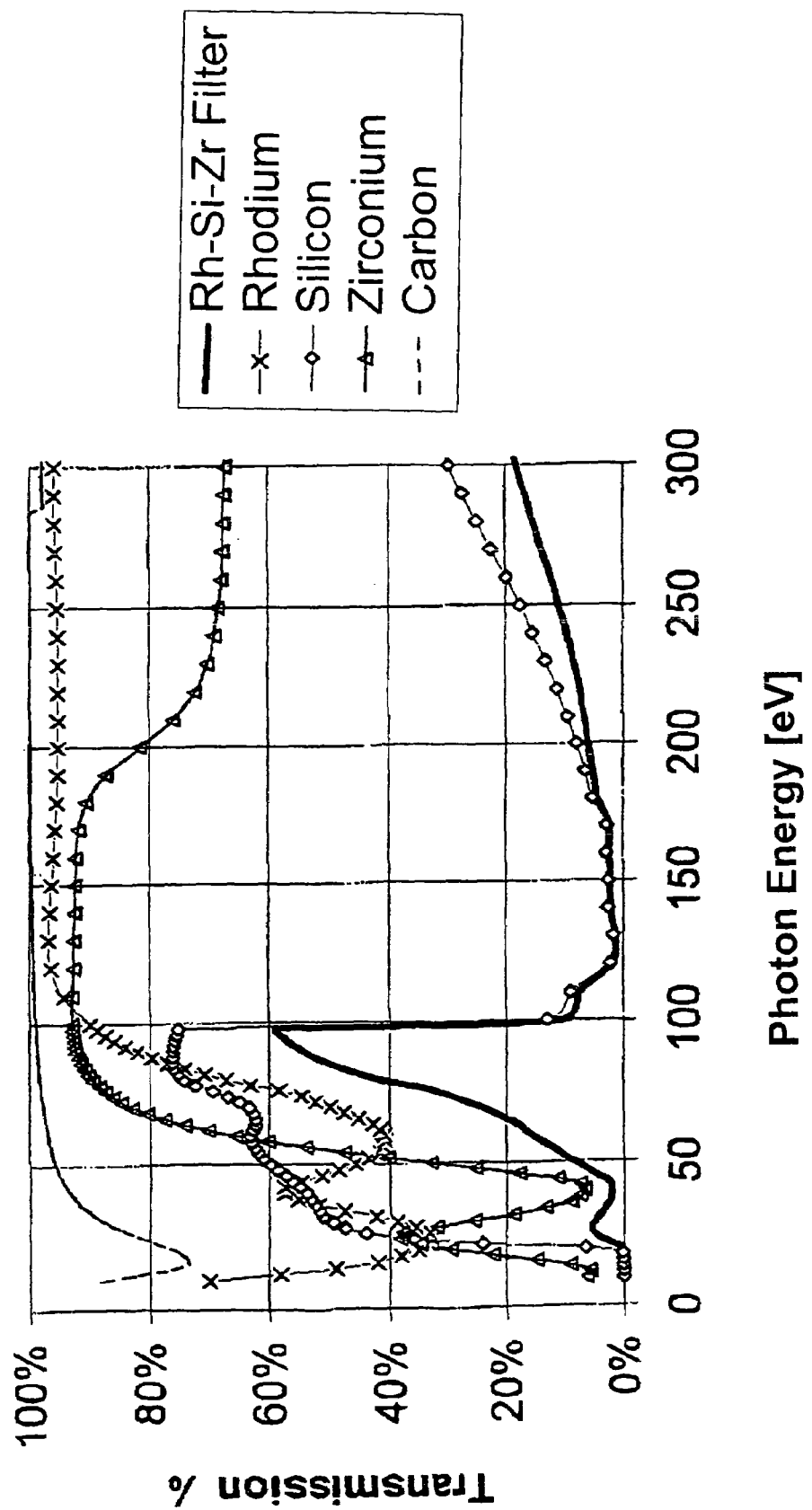

FIG. 1c shows a corresponding diagram for a filter of the layer system Rh—Si—Zr—Si—Rh.

Figure 2A:
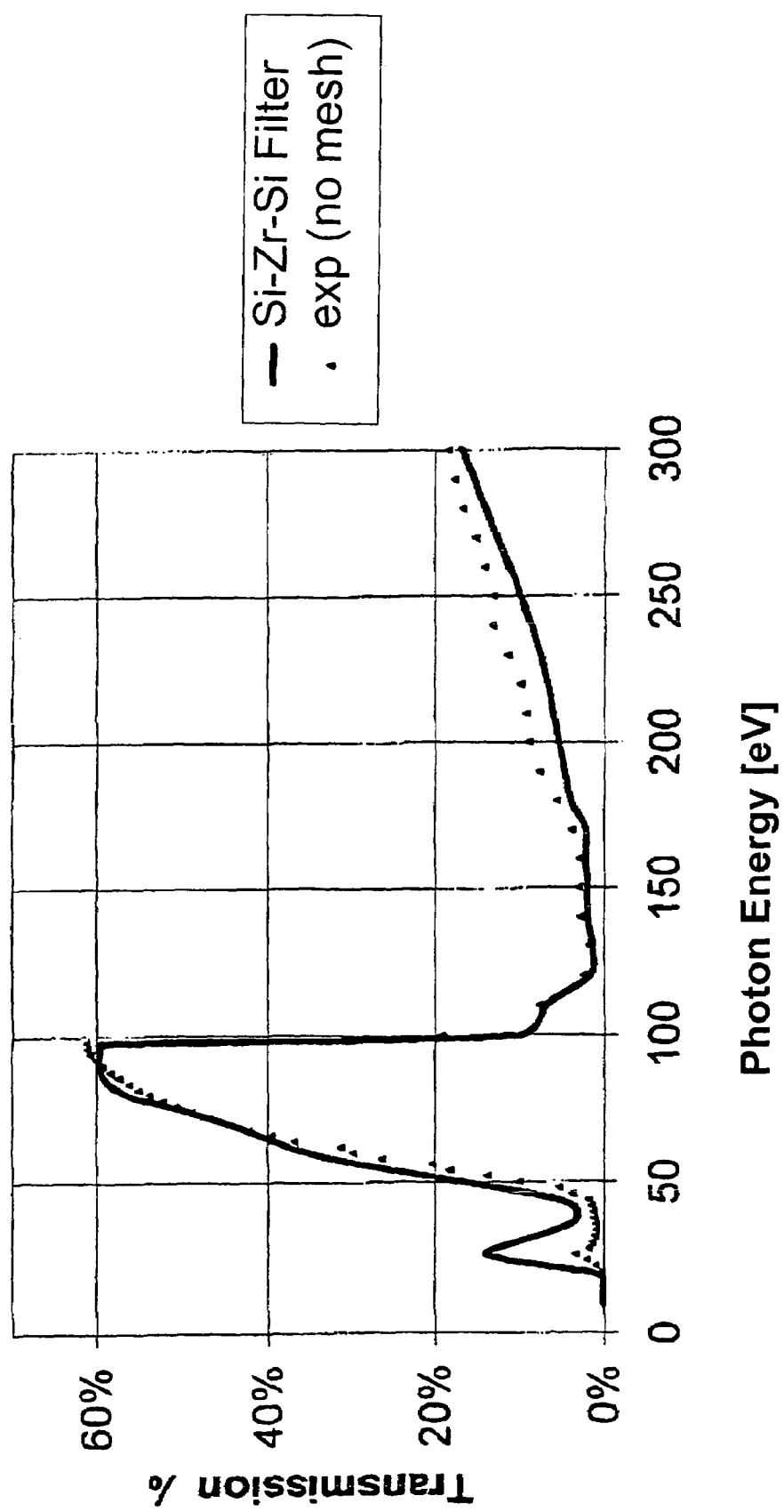
FIGS. 2a–d: | show the spectral characteristics of filters without support structure and with support structure; |
| FIGS. 3a, b | show the effect of different filters when disposed at a synchronotron radiation source; |
|
Figure 2B:
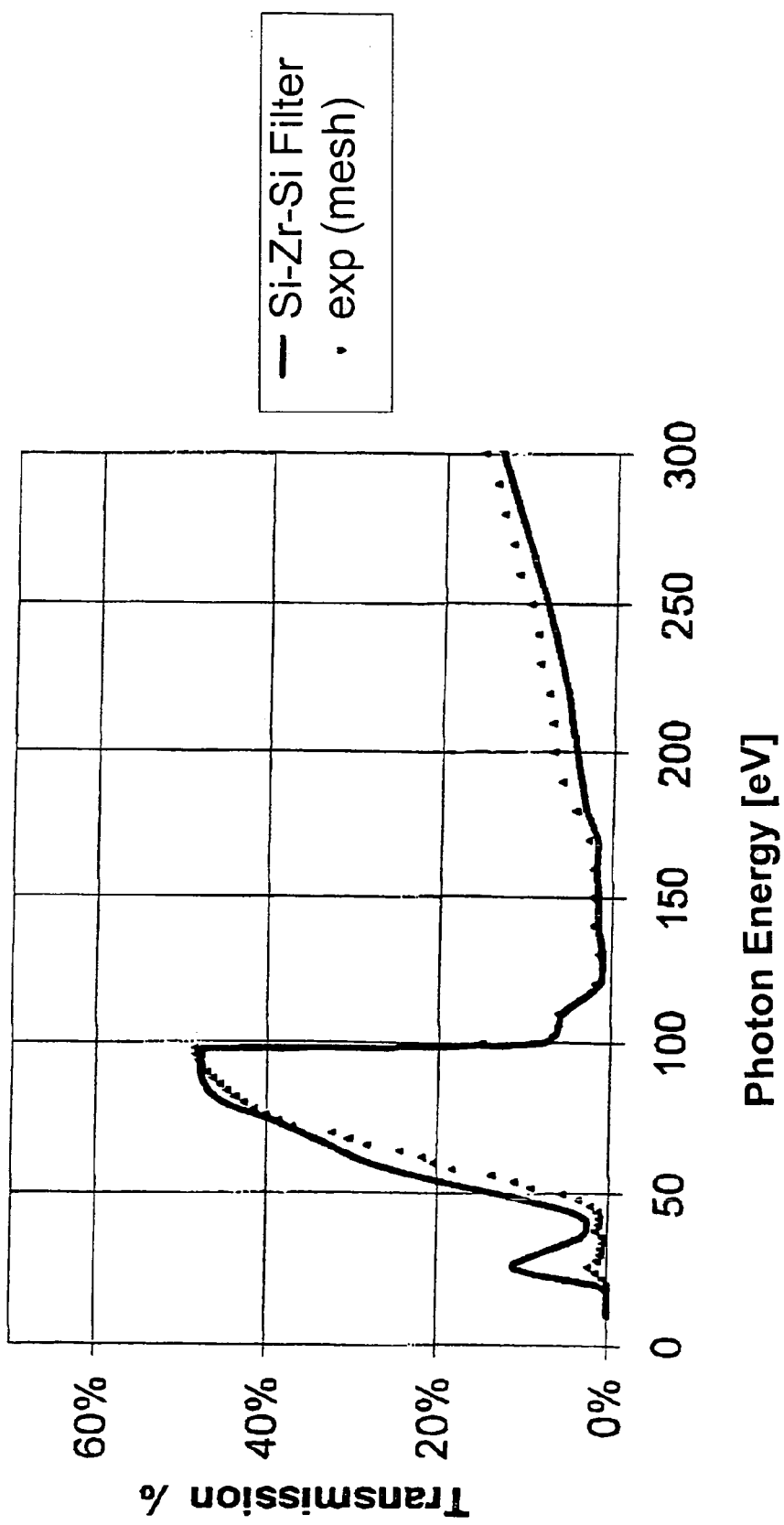

FIGS. 2a, 2b show the spectral characteristics for filter (Si—Zr—Si) without support structure and filter (Si—Zr—Si) with support structure. Here, the theoretically calculated values are also compared to experimentally measured values. The support structure is a mesh-shaped support structure made of nickel with a mesh width corresponding to 70 lines/inch. The improvement of the mechanical and thermal stability obtained with the mesh-shaped support structure is accompanied by a loss of 20% of transmission as compared to filters without support structure.

Figure 2C:
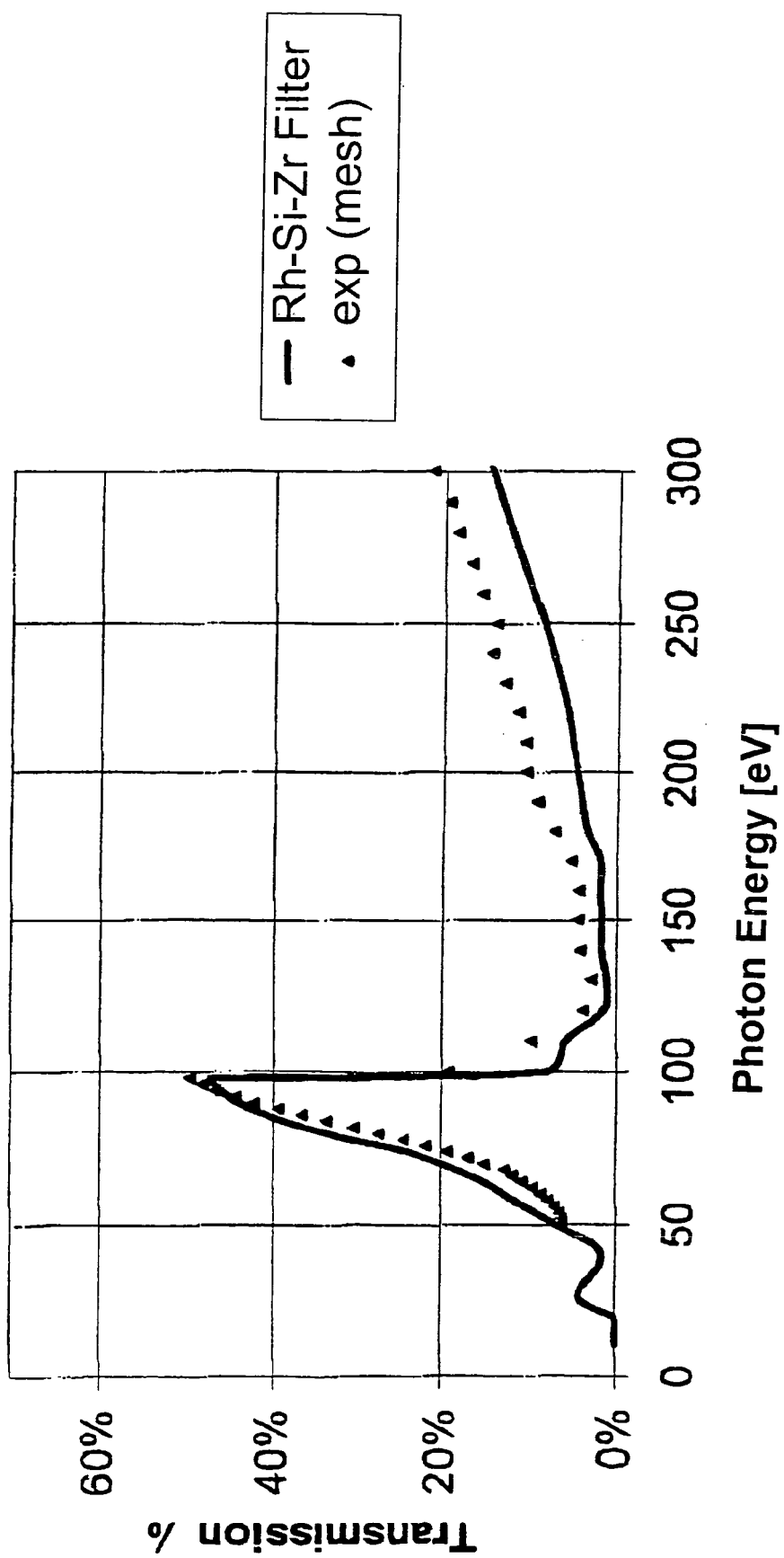

For purposes of comparison, FIG. 2c shows the spectral characteristic of a filter with mesh and with rhodium coating for preventing the oxidation on the surface. The layer sequence in this filter is as follows: Rh—Si—Zr—Si—Rh.

Figure 2D:
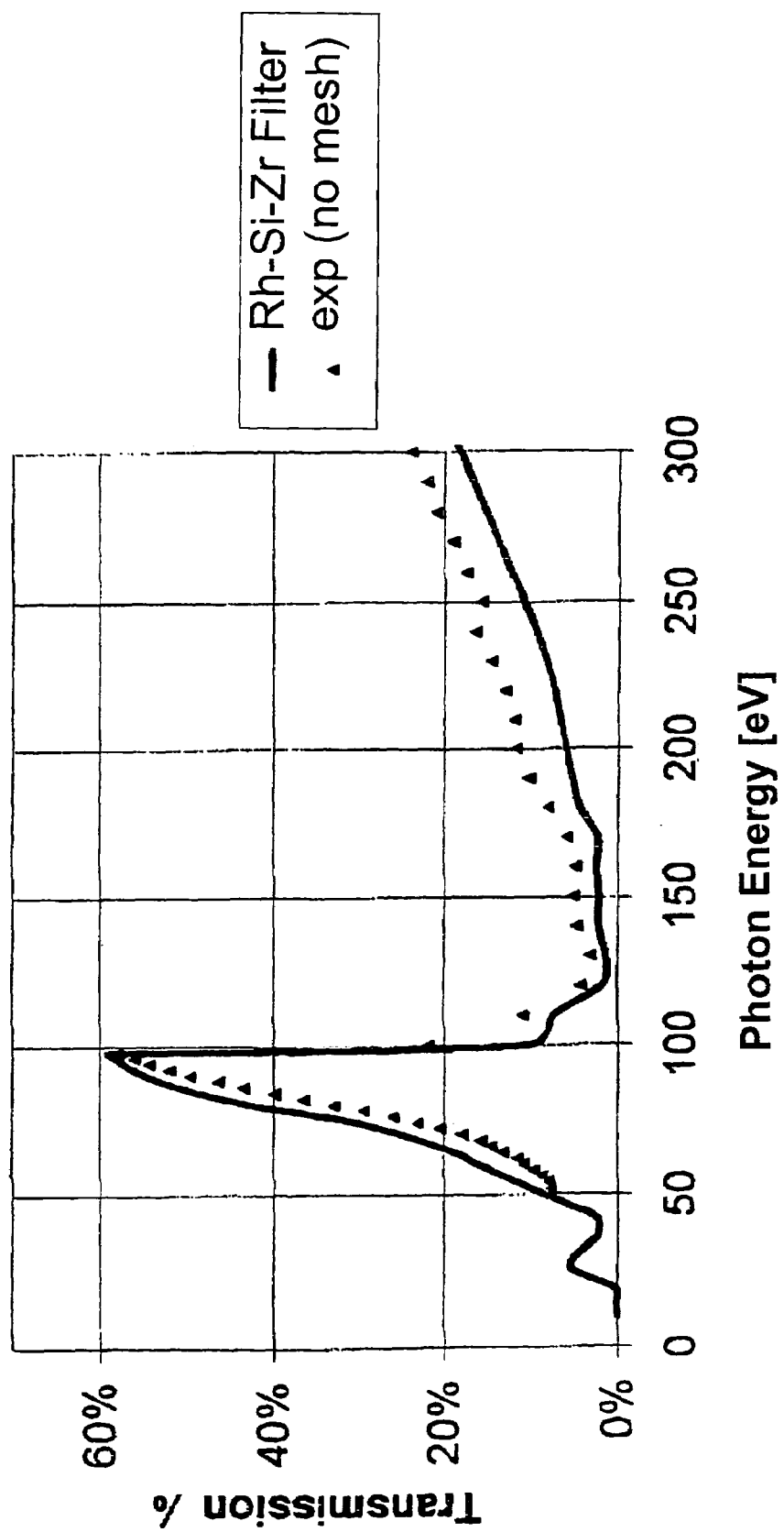

FIG. 2d shows the corresponding diagram of a filter with the layer structure Rh—Si—Zr—Si—Rh without mesh structure.

Figure 3A:
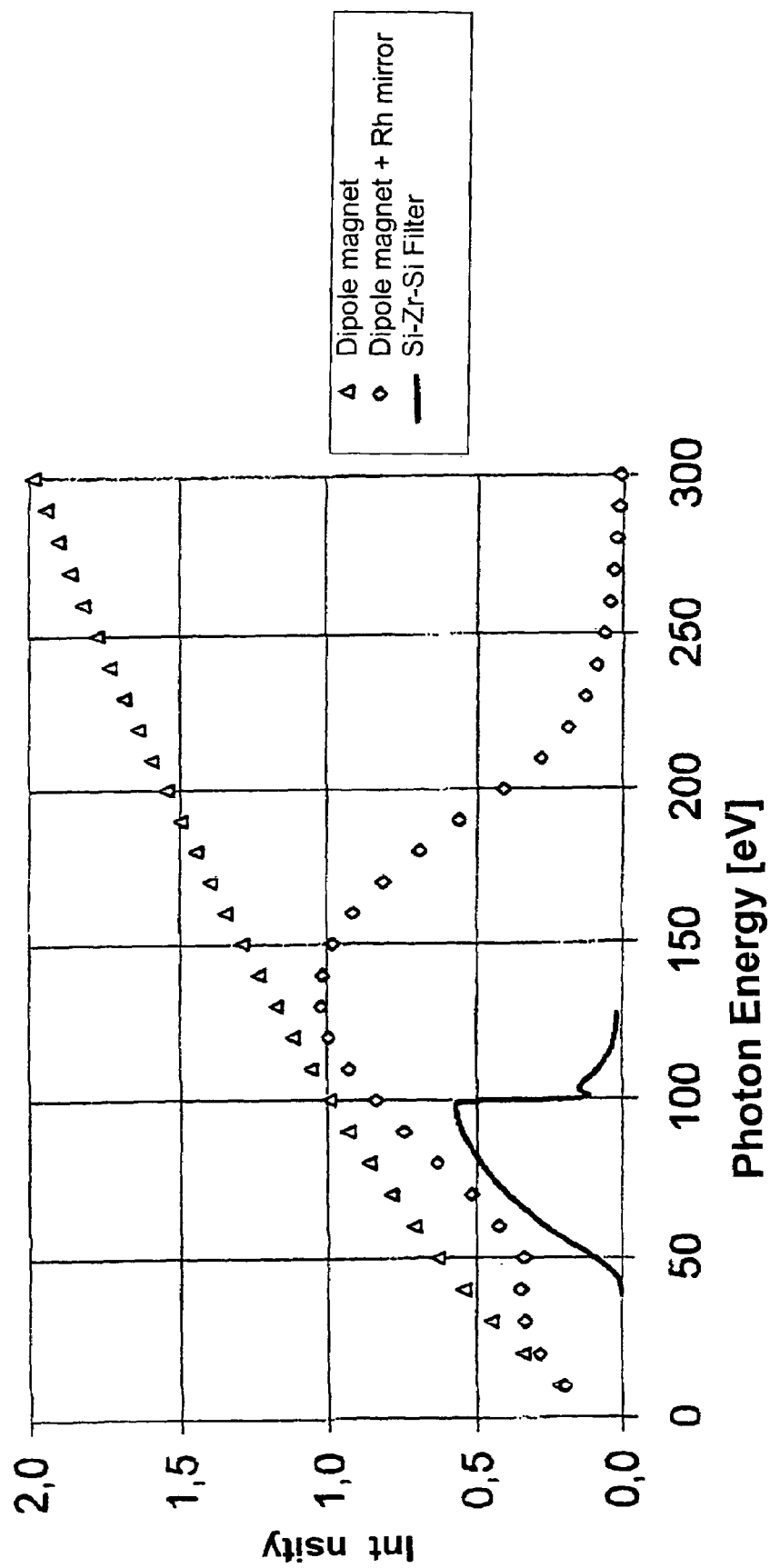

FIG. 3a shows the spectral characteristic of the radiation of a dipole magnet on the electron storage ring facility BESSY II. as well as the spectral characteristic of the radiation of the dipole magnet after reflection on a rhodium-coated mirror under a deflection angle of 10°. The plotted intensity was scaled for the maximum intensity of the radiation of the dipole magnet after reflection on the rhodium-coated mirror. If a filter (Si—Zr—Si) as described above is disposed after a dipole magnet and a rhodium mirror, a maximum intensity of approximately 92 eV with a half-width of peak of approximately 35 eV is obtained.

Figure 3B:
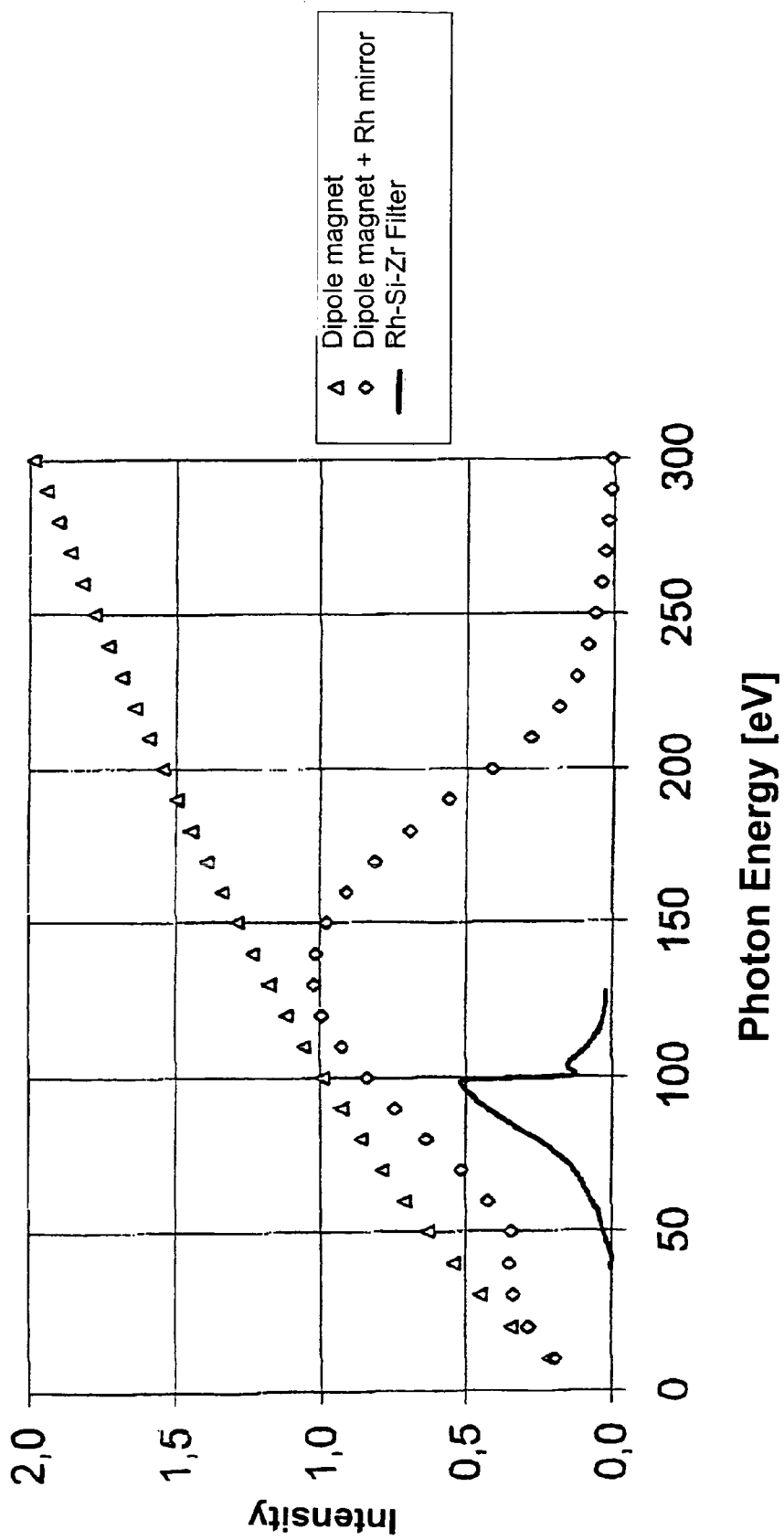

FIG. 3b shows, instead of the spectral characteristic of the first test filter, the spectral characteristic of the second test filter (Rh—Si—Zr—Si—Rh). The half width of peak in this case amounts to only still approximately 20 eV. The radiation after the test filters is very well suitable as initial radiation for the optical elements of an EUV lithography system.

During a life test, an EUV radiation with 1 W/cm$^2$ over 200 hours in a vacuum of 10$^{-8}$ mbar at both filters did not lead to any measurable change. When stored in the atmosphere, no change was noticeable in the transmission properties within a period of twelve months.

Figure 4A:
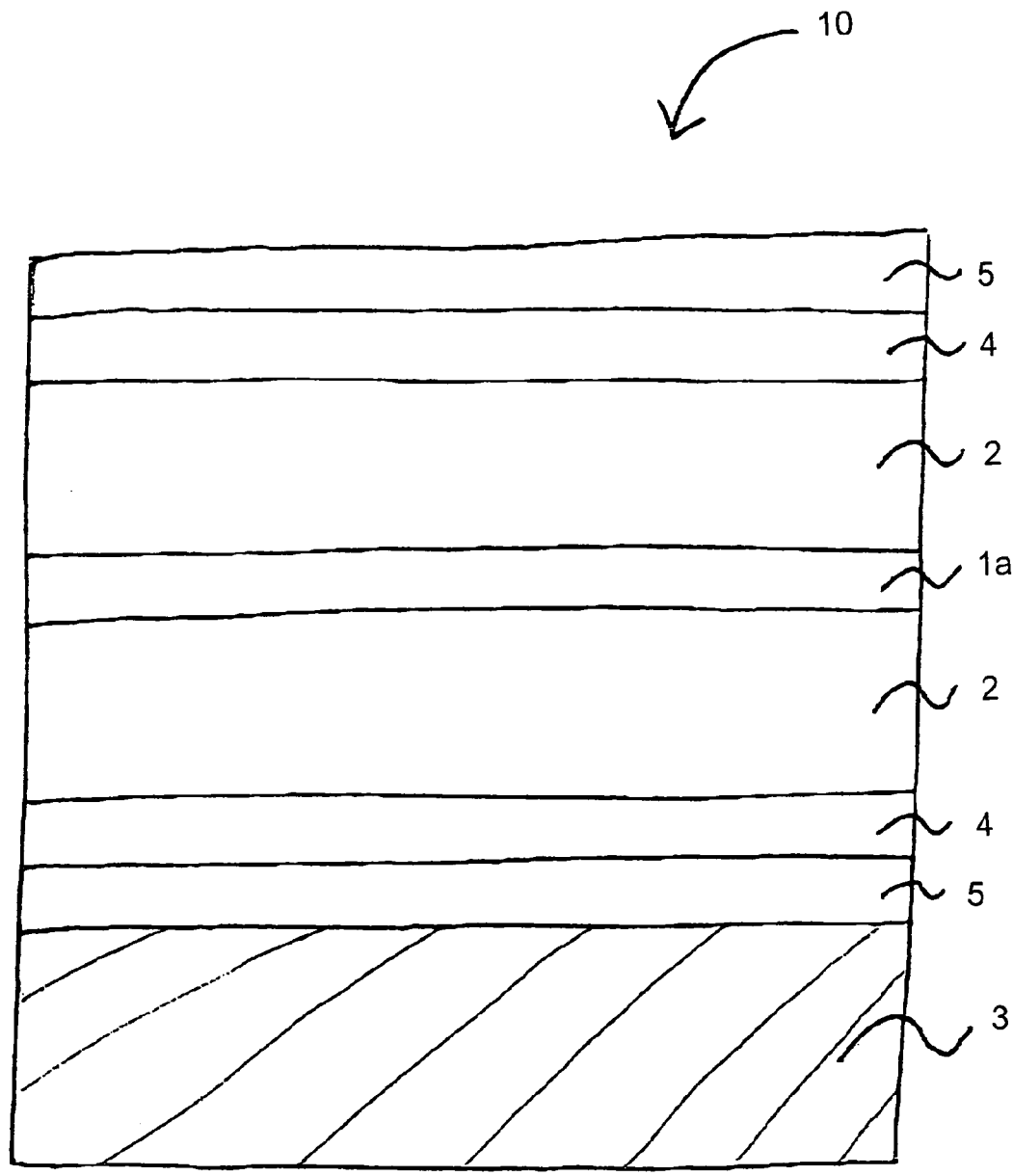
FIGS. 4a–c: | show the structure of different filters; |
|

FIG. 4a shows the schematic structure of a filter 10. 50 nm to 100 nm thick silicon layers 2 are disposed on both sides of a zirconium layer 1a of 10 nm to 40 nm thickness. On both sides, 1 nm to 2 nm thick oxide layers 4 and 0.5 nm to 1.5 nm thick carbon-containing layers 5 have been deposited, but have no decisive influence on the transmission behavior of the filter 10. The overall system is installed on a nickel mesh 3 to obtain mechanical and thermal stabilization.

Figure 4B:
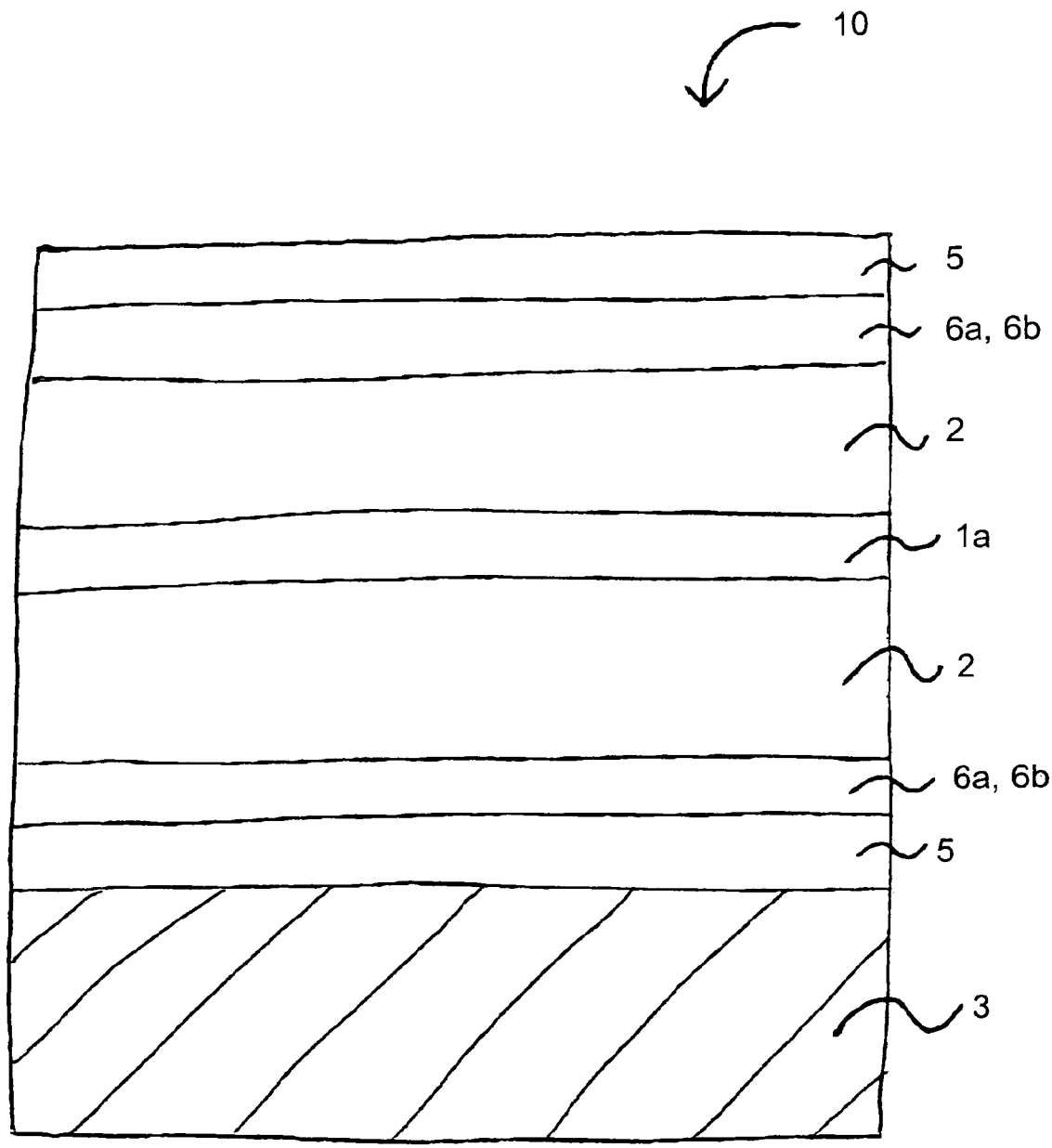

FIG. 4b shows the structure of an additional filter 10. On both sides of the filter 10, the zirconium layer 1a and the two silicon layers 2 each have a 0.1 nm to 50 nm (preferably 1 nm to 20 nm, in particular, 5 nm) thick ruthenium layer 6a or rhodium layer 6b on which a 0.5 nm to 1.5 nm, in particular, 1 nm thick carbon-containing layer 5 is deposited in the atmosphere. Optionally, diffusion barriers containing boron, carbon, nitrogen, and/or oxygen with a thickness of between 0.1 nm and 50 nm (preferably 0.1 nm and 10 nm, in particular, 2 nm) may be provided between the layers 6a or 6b and the silicon layers 2. Due to the ruthenium layers 6a or rhodium layers 6b, not only the mechanical stability and the service life are improved, but the spectral characteristic of the filter 10 is also narrowed.

The overall system is disposed on a nickel mesh 3 for the purpose of mechanical and thermal stabilization.

Figure 4C:
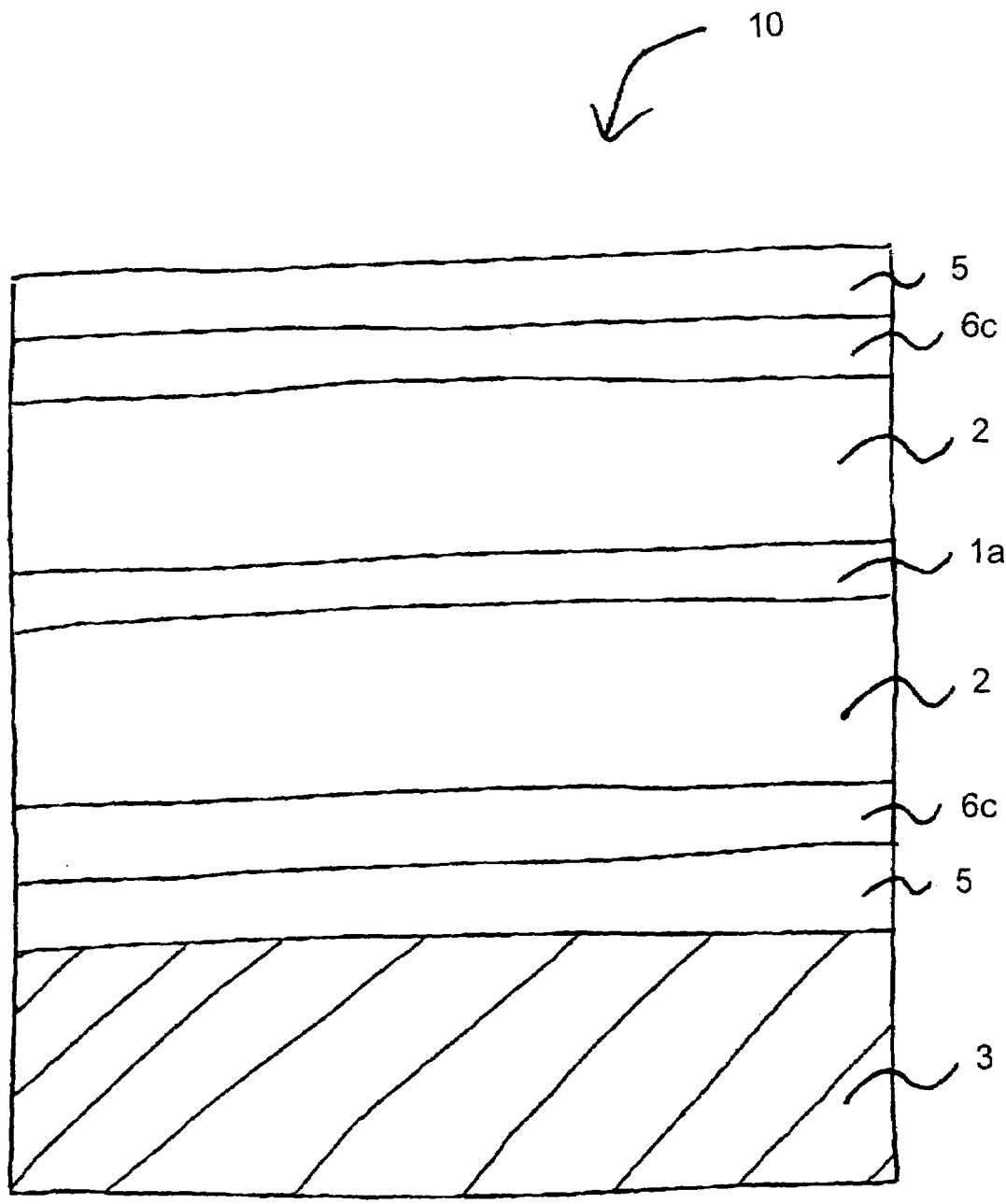

Instead of a ruthenium layer 6a or rhodium layer 6b, a layer 6c containing boron, carbon, nitrogen, and/or oxygen with a thickness of between 0.1 nm and 50 nm could also be applied directly on the silicon layers 2 during the manufacturing process, while, if warranted, an additional carbon-containing layer 5 of 0.5–1.5 nm thickness would be deposited on the said layer 6c in the atmosphere (see FIG. 4c).

Figure 5A:
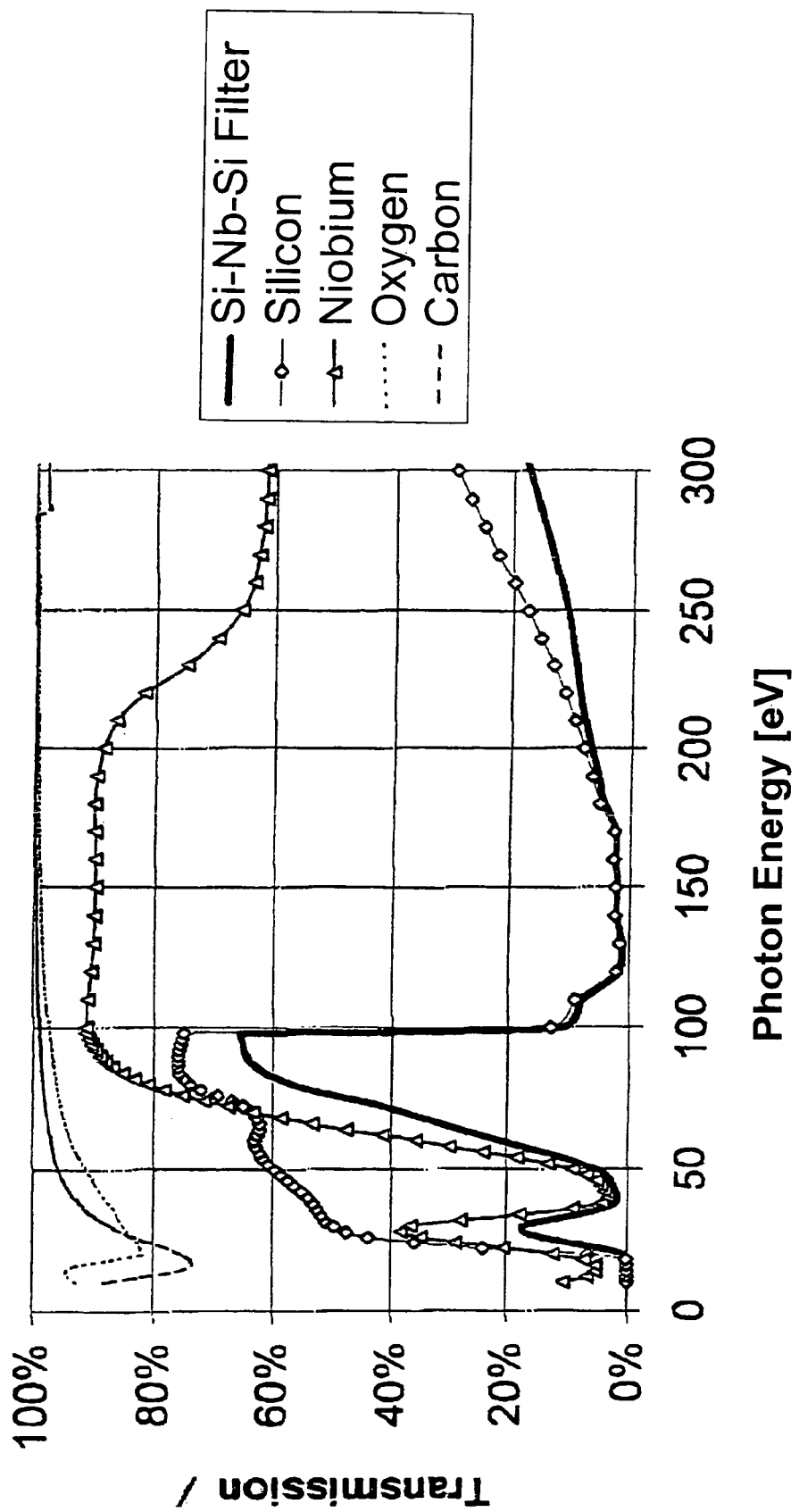
FIGS. 5a–d: | show the spectral characteristics of the individual layers and of the filters composed thereof; |
| FIGS. 6a, b: | show the structure of different filters; |
|

FIG. 5a shows the spectral characteristics of the individual materials silicon, niobium, oxygen, and carbon in the thicknesses listed above. Furthermore, the spectral characteristic of the resulting filter (Si—Nb—Si) is shown. As visible in FIG. 5a, the transmission of niobium considerably decreases from approximately 70 eV on toward lower photon energies. The transmission of silicon, on the other hand, considerably decreases from 98 eV toward higher photon energies. The transmission of the oxide layer in the relevant range around 92 eV (corresponds to 13 nm) is approximately constant. The fact that the oxygen oxidizes the silicon does not influence the transmission; the important factor is only the number of atoms being present. The transmission of the carbon layer is a constant 1 in an initial approximation. The spectral influence of the thin, natural oxide as well as the carbon layer thus is very small. These layers, however, positively influence the service life of the optical filter in the atmosphere as well as in the vacuum under EUV radiation. The filter has the effect that a transmission of more than 60% exists for the energy band around 92 eV. Below 50 eV and above 100 eV, the transmission is clearly under 10%. Only above 250 eV does the transmission begin to rise again above 10%. But since none of the sources known today and useable as light source for the EUV lithography shows notable flows in this energy range, this fact is not very significant.

Figure 5B:
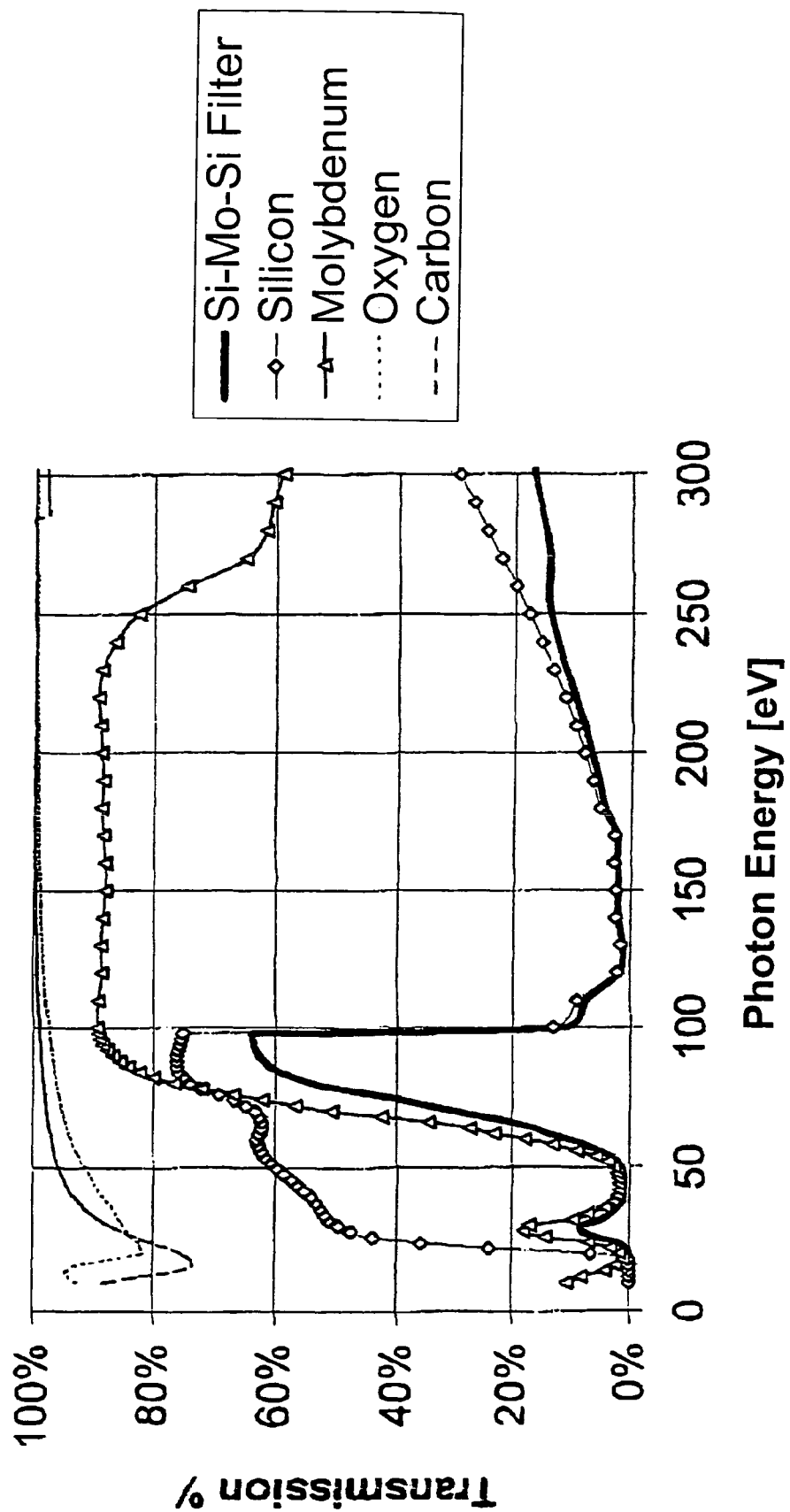

FIG. 5b shows the spectral characteristics of the individual materials silicon, molybdenum, oxygen, and carbon in the above indicated thicknesses. Furthermore, the spectral characteristic of the resulting filter (Si—Mo—Si) is shown. As can be concluded from FIG. 5b, the transmission of molybdenum considerably decreases from approximately 70 eV on toward lower photon energies. The transmission of silicon, on the other hand, considerably decreases from 98 eV on toward higher photon energies. The transmission of the oxide layer in the relevant range around 92 eV (corresponds to 13 nm) is approximately constant. The fact that the oxygen oxidizes the silicon does not influence the transmission; the only important factor is the number of atoms being present. The transmission of the carbon layer is a constant 1 in an initial approximation. The spectral influence of the thin, natural oxide as well as the carbon layer thus is very small. These layers, however, have a positive influence on the service life of the optical filter in the atmosphere as well as in the vacuum under EUV radiation. The filter has the effect that a transmission of more than 60% exists for the energy band around 92 eV. Below 50 eV and above 100 eV, the transmission is clearly under 10%. Only above 200 eV does the transmission rise again above 10%. But since none of the sources known today and useable as light source for the EUV lithography shows notable flows in this energy range, this fact is not very significant.

Figure 5C:
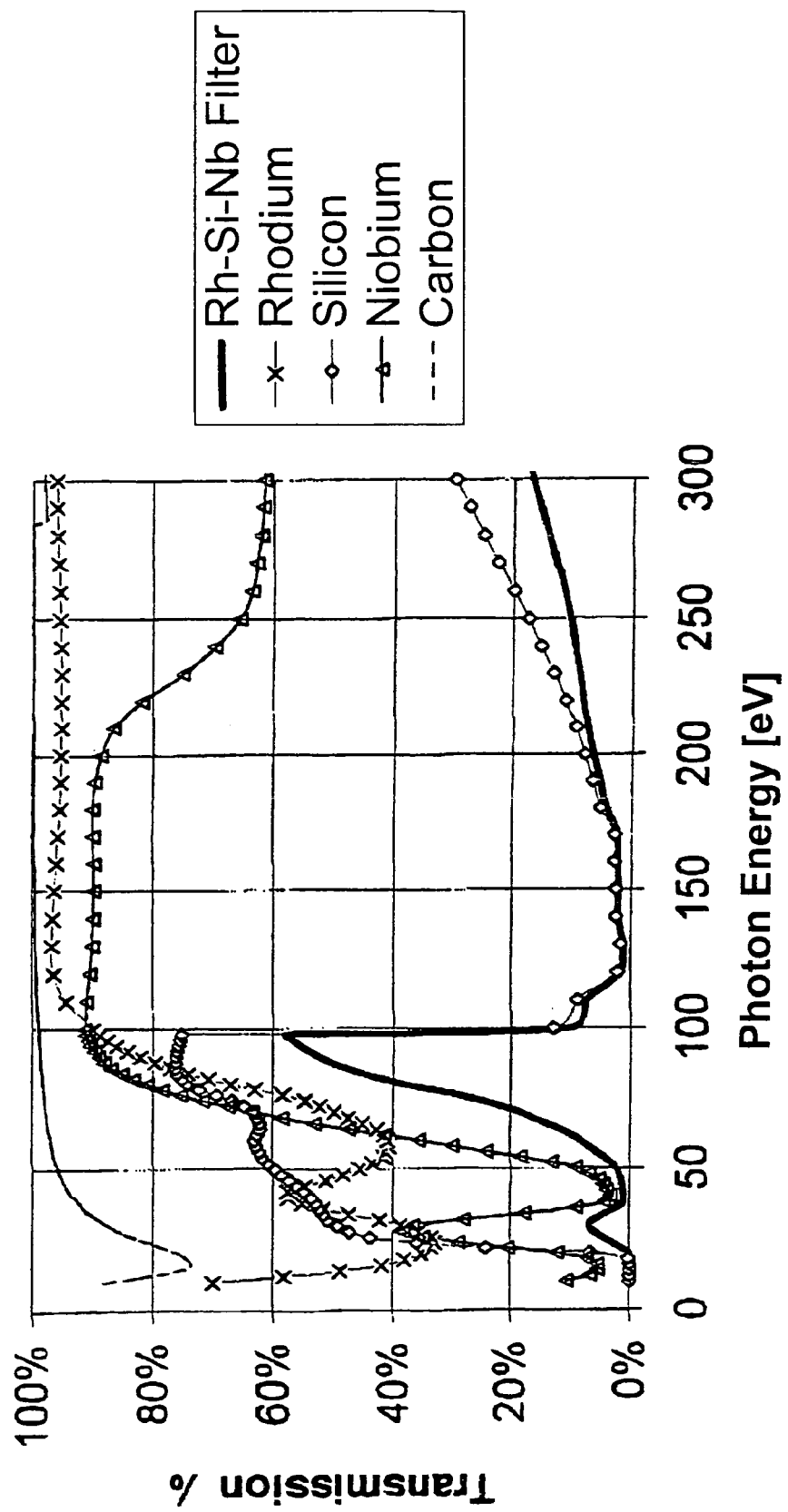
Figure 5D:
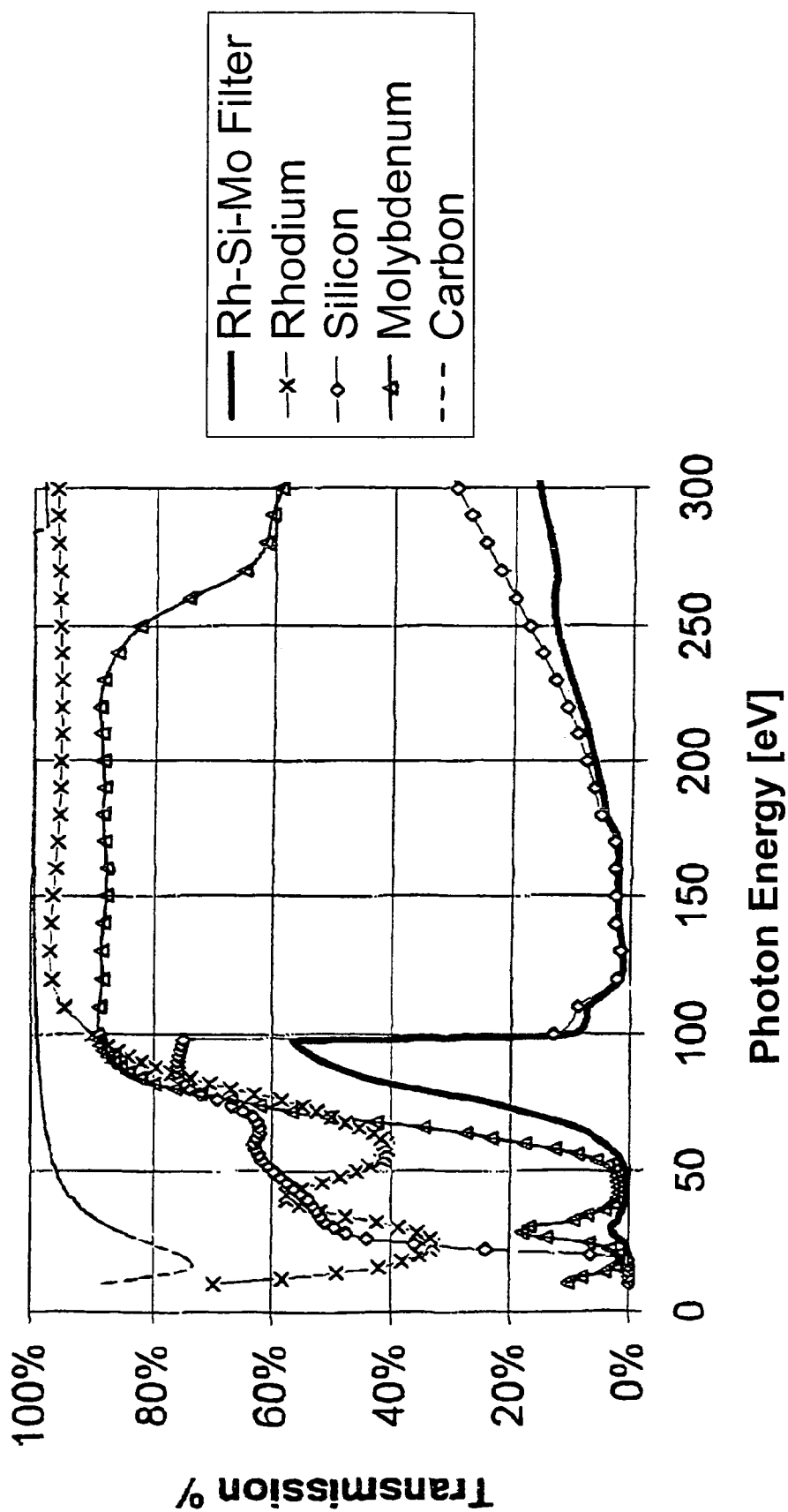

In FIGS. 5c and d, respectively, the spectral characteristic of rhodium is also shown, as well as the spectral characteristic of the resulting filter (FIG. 5c: Rh—Si—Nb—Si—Rh; FIG. 5d: Rh—Si—Mo—Si—Rh). Due to the low oxidation of the rhodium, only a carbon layer is formed on the filter surface. For the price of a reduced transmission amounting to a maximum of approximately 55%, a narrower spectral characteristic is obtained. The transmission in the range of between 50 eV and 80 eV is clearly reduced in relation to the filter (Si—Nb—Si— or Si—Mo—Si).

The investigated filters in FIGS. 1, 2, and 5 had the following layer thicknesses:

| | |
|---|---|
| Si | 80 nm each |
| Rh | 3 nm each |
| Zr, Nb, Mo | 20 nm. |

Figure 6A:
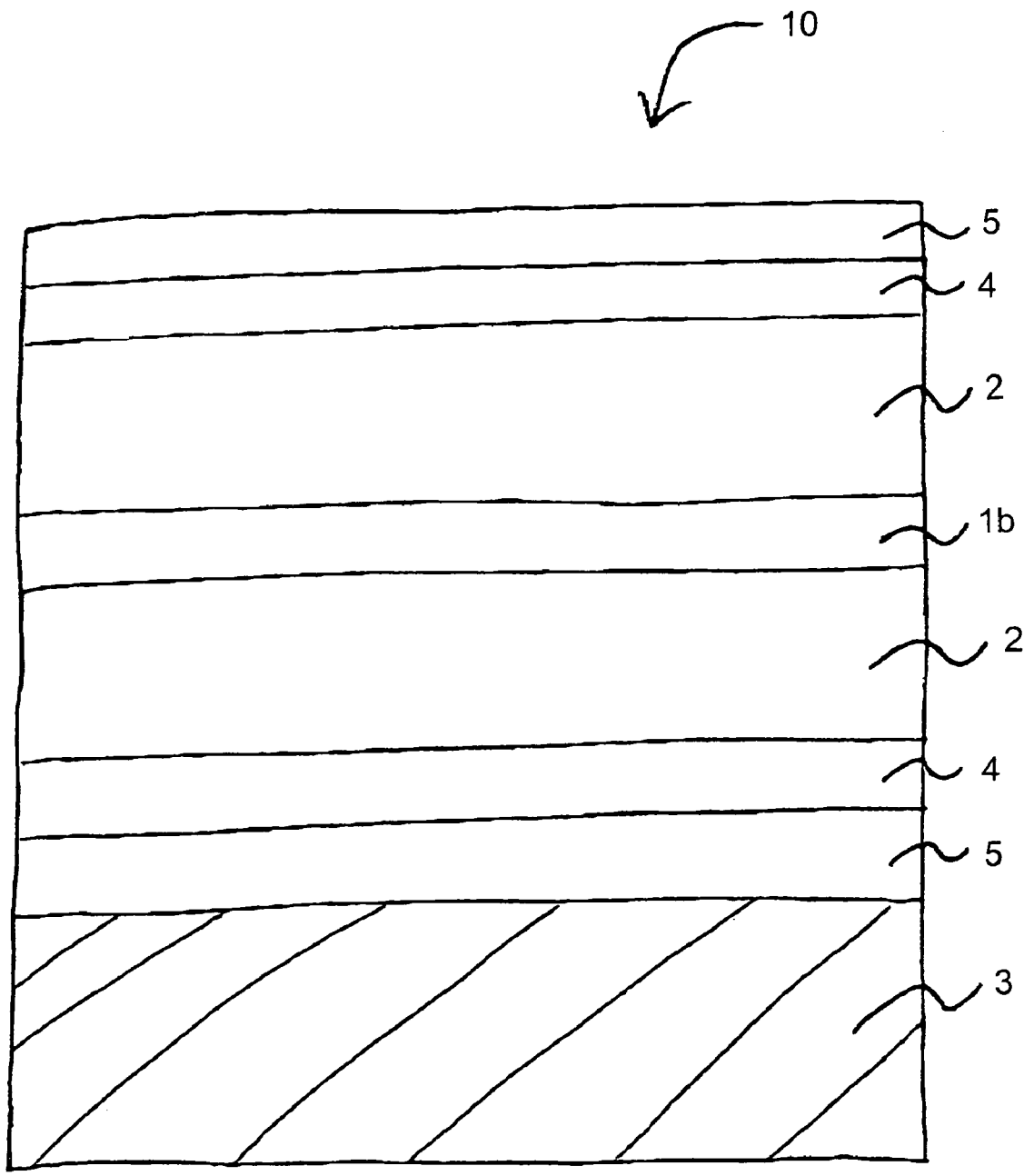

FIG. 6a shows the schematic structure of a filter 10. 50 nm to 100 nm thick silicon layers 2 are disposed on both sides of a 10 to 40 nm thick niobium layer 1b. On both sides, 1 nm to 2 nm thick oxide layers 4 and 0.5 nm to 1.5 nm thick carbon-containing layers 5 have been deposited which have no decisive influence on the transmission behavior of the filter 10. The overall system is disposed on a nickel mesh 3 for the purpose of mechanical stabilization. Instead of a niobium layer, a molybdenum layer 1b may be provided.

Figure 6B:
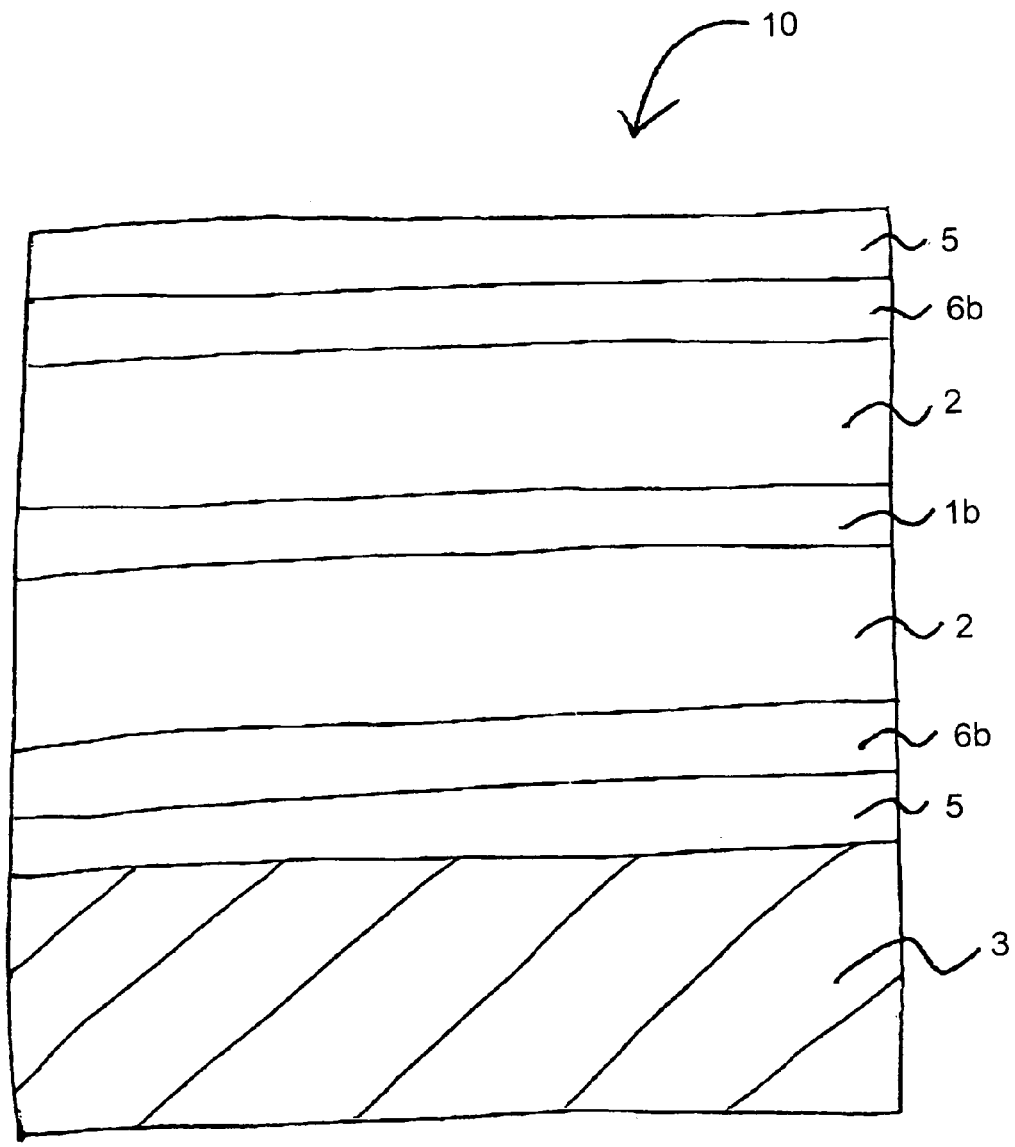

FIG. 6b shows the structure of an additional filter 10. On either side of the filter 10, the niobium layer 1b and the two silicon layers 2 have a 1 nm to 50 nm (preferably 1 nm to 20 nm) thick rhodium layer 6b on which 0.5 nm to 1.5 nm thick carbon-containing layers 5 are deposited in the atmosphere. Instead of the rhodium layers 6b, ruthenium layers may be provided. Optionally, diffusion barriers containing boron, carbon, nitrogen, and/or oxygen, with a thickness of between 0.1 nm and 50 nm (preferably 1 nm and 10 nm, in particular, 2 nm) may be provided between the rhodium layers 6b and the silicon layers 2. Due to the rhodium layers 6b, not only the mechanical stability and the service life are improved, but the spectral characteristic of the filter 10 is also enhanced.

The overall system is disposed on a nickel mesh 3 for the purpose of mechanical and thermal stabilization.

Instead of a stand-alone filter system, the materials may also be applied directly on an EUV component. In this case, the symmetry of the layer configuration around the central plane may be given up.

In analogy to FIG. 4c, instead of a rhodium layer 6b, a layer 6 containing boron, carbon, nitrogen, and/or oxygen with a thickness of between 0.1 nm and 50 nm could also be applied directly on the silicon layers 2 during the manufacturing process, while, if warranted, an additional carbon-containing layer 5 of 0.5–1.5 nm thickness would be deposited on the said layer 5 in the atmosphere.

Current experiments have shown that the installation of the described filter in the path of rays in a synchrotron radiation source leads to an increase by up to a factor of 5–10 in the service life of multi-layer mirrors placed subsequent to the same.

With the aid of the present invention, it has been possible to make a narrow-band spectral filter available, in particular, for EUV applications, wherein the spectral filter has not only a suitable spectral characteristic, but also a long service life under operational conditions and in the atmosphere, as well as high mechanical stability. Furthermore, it is suitable as protection against debris for subsequent optical elements. Due to its outstanding properties and economic efficiency, it is particularly suited for the use in mass production lithography with extreme ultraviolet light.

Figure 7:
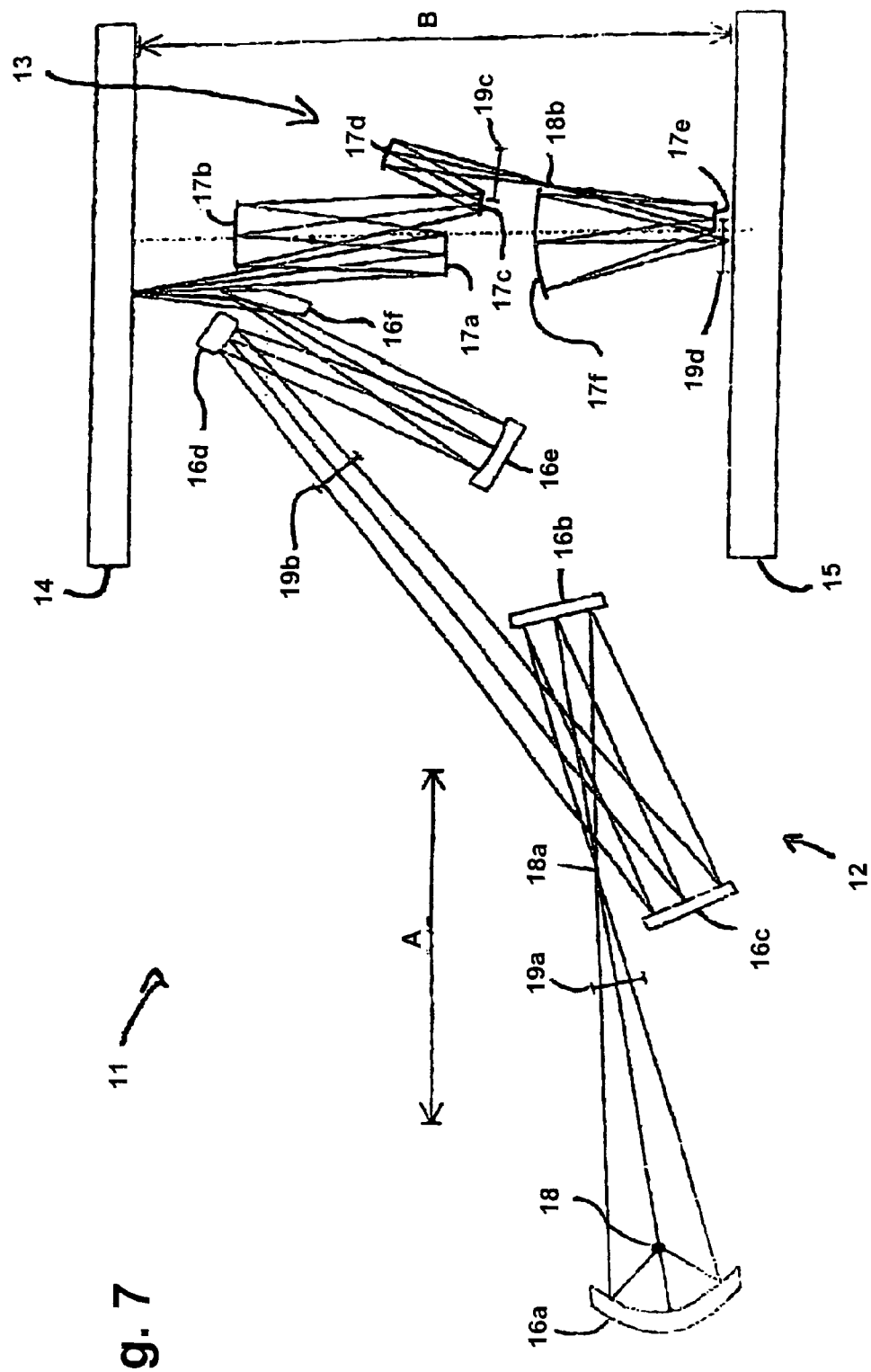
FIG. 7: | show an optical system with filter; and |
|

FIG. 7 shows a projection illumination system 11 with a light source 18, an illumination system 12 comprising the optical elements 16a–f, with a reticle 14, with a projection objective 13 comprising the optical elements 17a–17f, and with a wafer 15. The illumination system 12 is described in more detail in the application DE 101 00 265.3. The projection objective is described in more detail in the application DE 199 48 240.3. A laser plasma source, or a pinch plasma source, is used as light source 18. The light of the light source 18 is projected by a collector unit designed as ellipsoid mirror 16a on a secondary light source 18a. Subsequently, the light passes through a reflective honeycomb condenser consisting of the mirrors 16d and 16c. The subsequent field lens with the mirrors 16d, 16e, and 16f illuminates the reticle 14 with a ring field and adjusts the output pupil of the illumination system to the input pupil of the projection objective 13. The projection objective 13 projects the lighted part of the reticle 14 on the wafer 15, a substrate equipped with a light-sensitive layer, also called resist. For this, the light beam is reflected from the mirrors 17a through 17f. The projection objective 13 here has an intermediate image 18b. The optical axis of the projection objective 13 is indicated by the dotted line.

With 19a through d, positions are plotted at which the filter according to the invention, indicated by a line with two crossbeams, can be placed. These positions are to be understood as no more than examples. The filters are appropriately placed at points at which the beam cross section is relatively small, but outside of the beam waists and focus points. The filter may serve as vacuum-related separation between the radiation source and the optical system, as for example at point 19a. It may also serve as vacuum-related separation between the optical system and the resist-coated wafer 15, as for example at point 19d. The arrows identified as A and B indicate the dimensions of the projection illumination system 11. A represents 1 m, while B shows barely 1.50 m. The optical elements have diameters of approximately 30 cm. Conventionally, only one filter will be placed in the path of rays. For filters with very good transmission, the question will also be weighed whether two or more filters should be placed in the path of rays.

In EUV projection lithography, it is particularly advantageous to use means for the spectral constriction of the used EUV radiation subsequent to the radiation source. These means may be absorption filters as the above described filters or a combination of a diffraction grating and a ray trap. Also conceivable are all other elements with which the wavelength spectrum of the source radiation is constricted to the useful range around 92 eV. The means for the spectral constriction should filter out the spectral range below 50 eV and above 100 eV or reduce the transmission in these wavelength ranges preferably to less than 10% of the maximum intensity, respectively. The filter almost completely filters out, in particular, the UV and the DUV radiation. Photo-induced effects, such as for example photo-chemistry in the UV and the DUV wavelength range are drastically suppressed. This is, aside from the radiation within the spectral range required for EUV lithography have also shares in the visible spectral range as well as in the UV and the DUV. Due to the spectral constriction, combination effects on the mirror surfaces of the subsequent elements of the projection illumination system, due to photo-induced processes, can be clearly reduced.

Figure 8A:
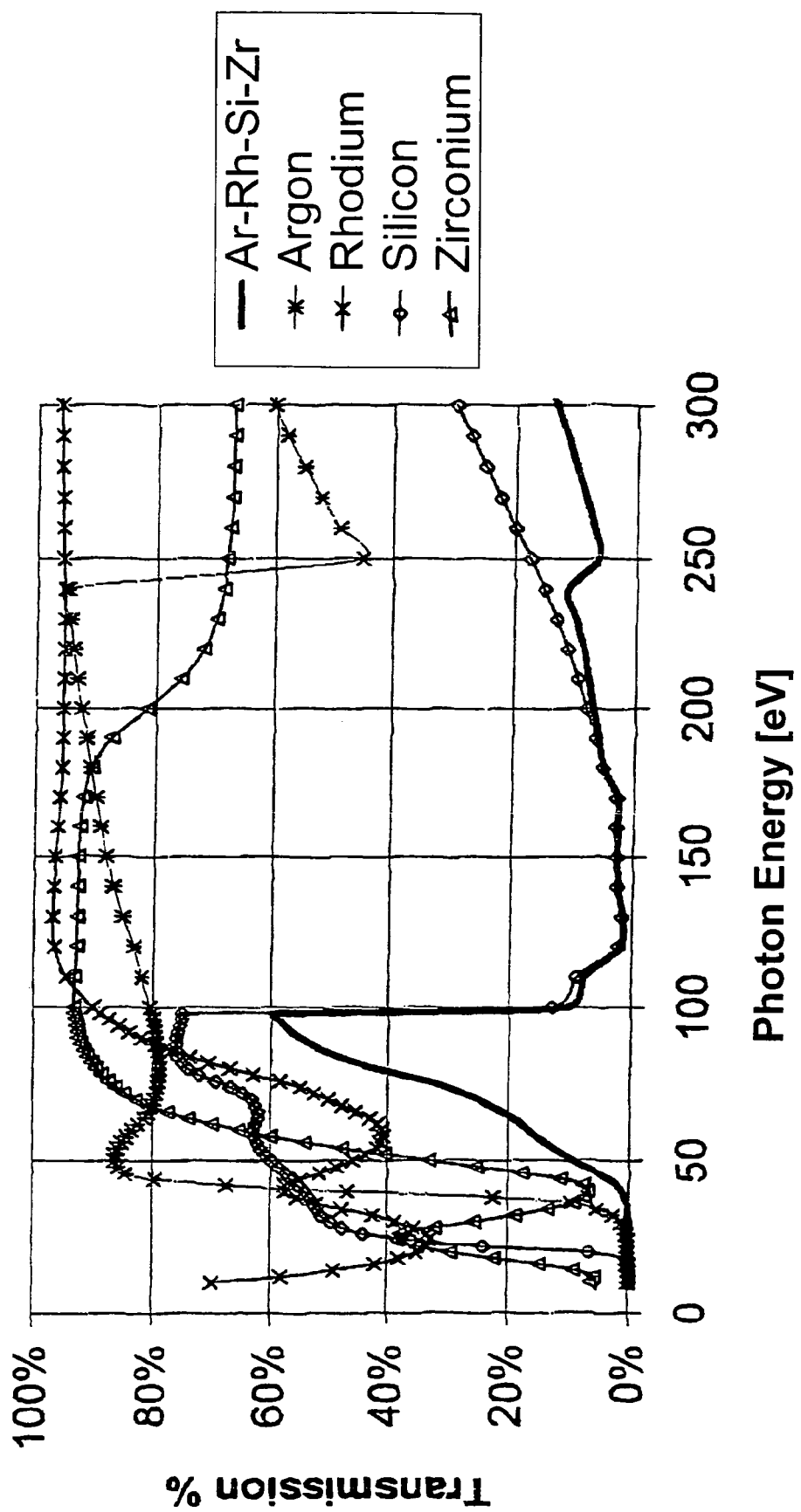
Figure 8B:
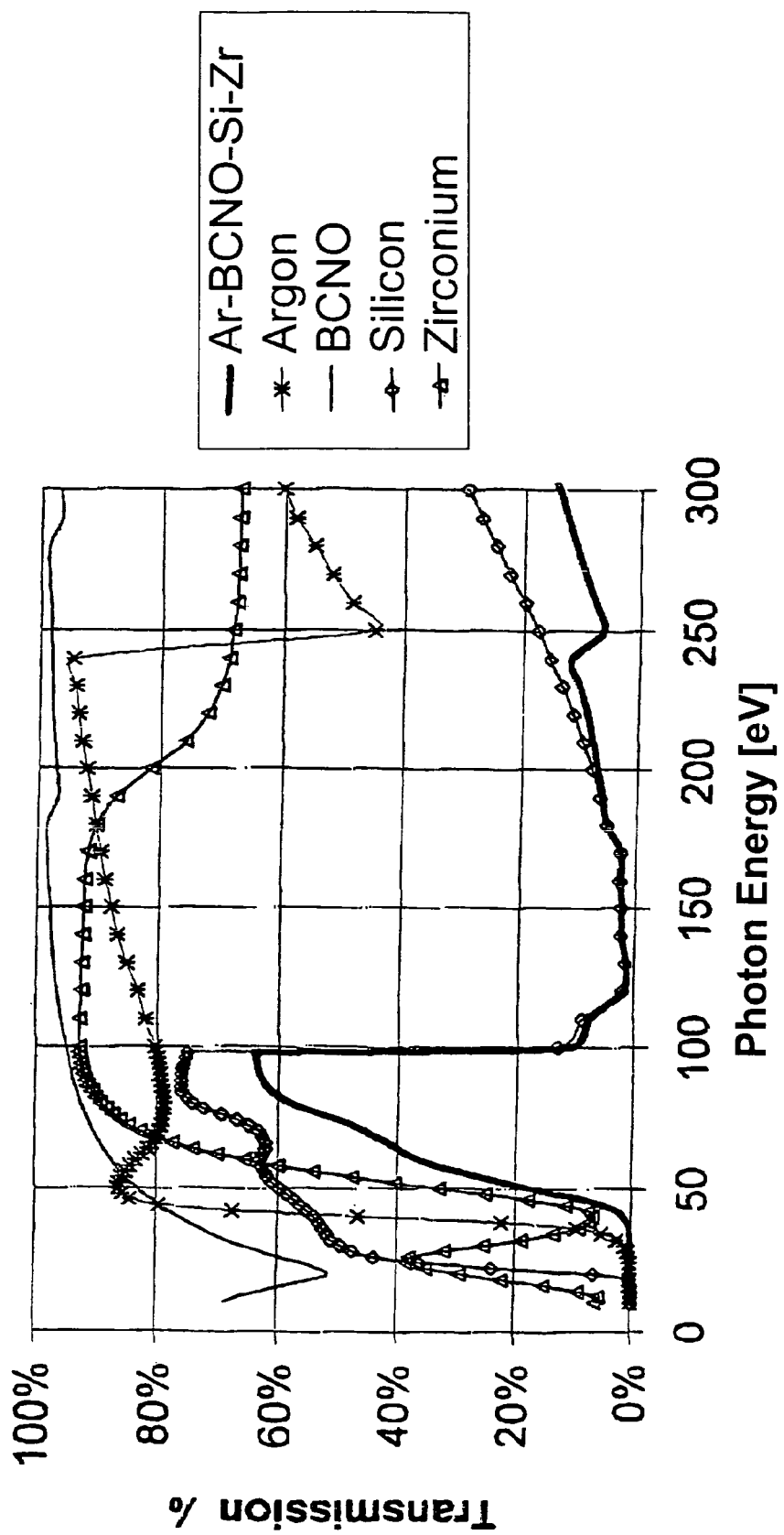
Figure 8C:
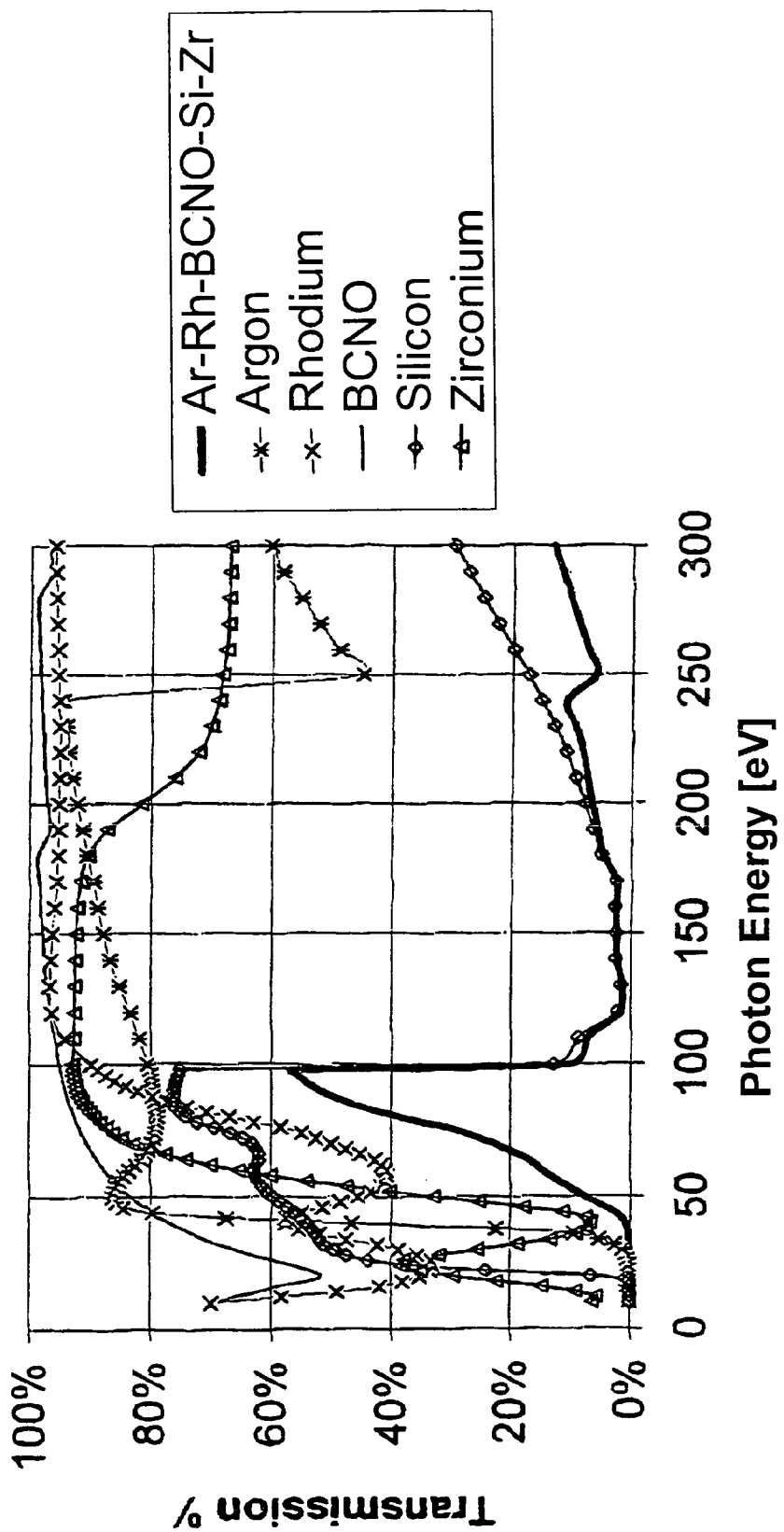

FIGS. 8a–d show additional filter embodiments with the following layer sequences:

| | |
|---|---|
| FIG. 8a: | Ar (1 m at 0.05 mbar)/Rh (3 nm)/Si (80 nm)/Zr (20 nm)/ Si (80 nm)/Rh (3 nm)/Ar (1 m at 0.05 mbar); |
| FIG. 8b: | Ar (1 m at 0.05 mbar)/"BCNO"(3 nm)/Si (80 nm)/Zr (20 nm)/ Si (80 nm)/"BCNO" (3 nm)/Ar (1 m at 0.05 mbar); |
| FIG. 8c: | Ar (1 m at 0.05 mbar)/Rh (3 nm)/"BCNO"(3 nm)/Si (80 nm)/ Zr (20 nm)/Si (80 mn)/"BCNO"(3 nm)/Rh (2 nm)/Ar (1 m at 0.05 mbar); |
| FIG. 8d: | Ar (1 m at 0.05 mbar)/Rh (3 nm)/Zr (20 nm)/Rh (3 nm)/ Ar (1 m at 0.05 mbar). |

In all cases, it is planned to dispose a 1 m thick gas layer of argon gas with a pressure of 0.05 mbar before and after the filter wherein the gas layer also contributes to the filtering process.

The example shown in FIG. 8d is preferably used in connection with EUV sources which in any case do not emit any radiation above 100 eV. Radiation with a characteristic of this type can also be achieved by pre-filtering the radiation with Si-containing filters. The advantage of this filter lies in a higher transmission in the range around 92 eV with a continued strong suppression below 80 eV.

The invention claimed is:

1. An optical filter, consisting of:
two silicon layers with one zirconium layer interposed between the two silicon layers, and (a) a support structure, (b) a protective layer on at least one side of the three layers, (c) a ruthenium layer or rhodium layer on at least one side of the three layers, or (d) a layer containing boron, carbon, nitrogen or oxygen, or a combination thereof on at least one side of the three layers, or a combination of (a), (b), (c) and (d), and wherein the optical filter is used in transmission of radiation in the extreme ultraviolet wavelength range and has a transmission of 50% or more for radiation of about 92 eV.

2. An optical filter according to claim 1, wherein the value of $1\ nm \leq dZr \leq 1,000\ nm$ is applicable for the thickness $dZr$ of the zirconium layer, while the thickness of the silicon layer is $dSi = 1e^{-k \cdot dZr}$ in μm with $0.001 \leq k \leq 0.005$ in 1/nm.

3. An optical filter according to claim 1, wherein the silicon layers have a thickness of between 50 nm and 100 nm, while the zirconium layer has a thickness of between 10 nm and 40 nm.

4. An optical filter according to claim 1, wherein the three layers are self-supporting.

5. An optical filter according to claim 1, wherein the filter has maximum dimensions of between 1 cm and 4 cm on the filter plane.

6. An optical filter according to claim 1, wherein the three layers are installed on the support structure.

7. An optical filter according to claim 6, wherein the support structure is a nickel mesh.

8. An optical filter according to claim 6, wherein the filter has maximum dimensions of between 8 cm and 14 cm on the filter plane.

9. An optical filter according to claim 1, wherein the support structure is interposed between two or within one of the three layers.

10. An optical filter according to claim 1, wherein the at least one additional layer having a protective function is disposed on at least one side of the filter.

11. An optical filter according to claim 10, wherein between an exterior layer and the silicon layer, the optical filter has the layer containing boron, carbon, nitrogen, and/or oxygen in a compound individually or in combination as a diffusion barrier layer.

12. An optical filter according to claim 11, wherein the diffusion barrier layer has a thickness of between 0.1 nm and 50 nm.

13. An optical filter according to claim 1, wherein the filter has the ruthenium layer or the rhodium layer on at least one side.

14. An optical filter according to claim 13, wherein the ruthenium layer or the rhodium layer has a thickness of between 0.1 nm and 50 nm.

15. An optical filter according to claim 1, wherein the filter has the layer containing boron, carbon, nitrogen, and/or oxygen on at least one side.

16. An optical filter according to claim 15, wherein the layer containing boron, carbon, nitrogen, and/or oxygen has a thickness of between 0.1 nm and 50 nm.

17. An illumination system for extreme ultraviolet light comprising an optical filter according to claim 1.

18. A projection illumination system for extreme ultraviolet light comprising an optical filter according to claim 1.

19. An optical apparatus with a path of rays for the EUV wavelength range, wherein the path of rays has at least one filter according to claim 1.

20. An optical apparatus according to claim 19, wherein at least the filter is disposed in a gas atmosphere, in particular, an Ar atmosphere with a pressure of $10^{-2}$ through $10^{-8}$ mbar.

21. An optical filter, consisting of:
one zirconium layer interposed between two silicon layers, wherein the silicon layers are thicker than the zirconium layer, and (a) a support structure, (b) a protective layer on at least one side of the three layers, (c) a ruthenium layer or rhodium layer on at least one side of the three layers, or (d) a layer containing boron, carbon, nitrogen or oxygen, or a combination thereof on at least one side of the three layers, or a combination of (a), (b), (c) and (d), and wherein the optical filter is used in transmission of radiation in the extreme ultraviolet wavelength range and has a transmission of 50% or more for radiation of about 92 eV.

22. An optical filter according to claim 21, wherein the value of $1\ nm \leq dZr \leq 1{,}000\ nm$ is applicable for the thickness dZr of the zirconium layer, while the thickness of the silicon layer is $dSi = 1 - e^{-k \cdot dZr}$ in μm with $0.001 \leq k \leq 0.005$ in 1/nm.

23. An optical filter according to claim 21, wherein the silicon layers have a thickness of between 50 nm and 100 nm, while the zirconium layer has a thickness of between 10 nm and 40 nm.

24. An optical filter according to claim 21, wherein the three layers are self-supporting.

25. An optical filter according to claim 21, wherein the filter has maximum dimensions of between 1 cm and 4 cm on the filter plane.

26. An optical filter according to claim 21, wherein the three layers are installed on the support structure.

27. An optical filter according to claim 21, wherein the support structure is interposed between two or within one of the three layers.

28. An optical filter according to claim 21, wherein the at least one additional layer having a protective function is disposed on at least one side of the filter.

29. An optical filter according to claim 21, wherein the filter has the ruthenium layer or the rhodium layer on at least one side.

30. An optical filter according to claim 21, wherein the filter has the layer containing boron, carbon, nitrogen, and/or oxygen on at least one side.

31. An illumination system for extreme ultraviolet light comprising an optical filter according to claim 21.

32. A projection illumination system for extreme ultraviolet light comprising an optical filter according to claim 21.

33. An optical apparatus with a path of rays for the EUV wavelength range, wherein the path of rays has at least one filter according to claim 21.

34. An optical apparatus with a path of rays for the EUV wavelength range, wherein the path of rays has at least one filter according to claim 21, wherein at least the filter is disposed in a gas atmosphere, in particular, an Ar atmosphere with a pressure of $10^{-2}$ through $10^{-8}$ mbar.

35. An optical filter, consisting of:
two silicon layers with one niobium or molybdenum layer interposed between the two silicon layers, and (a) a support structure, (b) a protective layer on at least one side of the three layers, (c) a ruthenium layer or rhodium layer on at least one side of the three layers, or (d) a layer containing boron, carbon, nitrogen or oxygen, or a combination thereof on at least one side of the three layers, or a combination of (a), (b), (c) and (d), and wherein the optical filter is used in transmission of radiation in the extreme ultraviolet wavelength range and has a transmission of 50% or more for radiation of about 92 eV.

36. An optical filter according to claim 35, wherein the silicon layers are thicker than the niobium or the molybdenum layers.

37. An optical filter according to claim 35, wherein a value of $1\ nm < dNb < 1{,}000\ nm$ is applicable for the thickness dNb of the niobium layer, while the thickness of the silicon layer is $dSi = 1 - e^{-k \cdot dNb}$ in μm with $0.001 < k < 0.005$ in 1/nm.

38. An optical filter according to claim 35, wherein a value of $1\ nm < dMo < 1{,}000\ nm$ is applicable for the thickness dMo of the molybdenum layer, while the thickness of the silicon layer is $dSi = 1 - e^{-k \cdot dMo}$ in μm with $0.001 < k < 0.005$ in 1/nm.

39. An optical filter according to claim 35, wherein the silicon layers have a thickness of between 50 nm and 100 nm, while the niobium or molybdenum layer, respectively, has a thickness of between 10 nm and 40 nm.

40. An optical filter according to claim 35, wherein the three layers are self-supporting.

41. An optical filter according to claim 35, wherein the filter has maximum dimensions of between 1 cm and 4 cm on the filter plane.

42. An optical filter according to claim 35, wherein the three layers are installed on the support structure.

43. An optical filter according to claim 35, wherein the support structure is interposed between two or within one of the three layers.

44. An optical filter according to claim 35, wherein the at least one additional layer having a protective function is disposed on at least one side of the filter.

45. An optical filter according to claim 35, wherein the filter has the ruthenium layer or the rhodium layer on at least one side.

46. An optical filter according to claim 35, wherein the filter has the layer containing boron, carbon, nitrogen, and/or oxygen on at least one side.

47. An illumination system for extreme ultraviolet light comprising an optical filter according to claim 35.

48. A projection illumination system for extreme ultraviolet light comprising an optical filter according to claim 35.

49. An optical apparatus with a path of rays for the EUV wavelength range, wherein the path of rays has at least one filter according to claim 35.

50. An optical apparatus with a path of rays for the EUV wavelength range, wherein the path of rays has at least one filter according to claim 35, wherein at least the filter is disposed in a gas atmosphere, in particular, an Ar atmosphere with a pressure of $10^{-2}$ through $10^{-8}$ mbar.

51. An optical filter, consisting of:

two silicon layers with one zirconium layer, niobium layer, or molybdenum layer interposed between the two silicon layers, wherein the optical filter is used in transmission of radiation in the extreme ultraviolet wavelength range, and wherein the three layers are self-supporting, and wherein the optical filter has a transmission of 50% or more for radiation of about 92 eV.

52. An optical filter according to claim 51, wherein the silicon layers have a thickness of between 50 nm and 100 nm, while the zirconium, niobium or molybdenum layer has a thickness of between 10 nm and 40 nm.

53. An optical filter according to claim 51, wherein the zirconium layer is present, and wherein the value of 1 nm$\leq$dZr$\leq$1,000 nm is applicable for the thickness dZr of the zirconium layer, while the thickness of the silicon layer is dSi=1 $e^{-k \cdot dZr}$ in μm with 0.001$\leq$k$\leq$0.005 in 1/nm.

54. An optical filter according to claim 51, wherein the niobium or molybdenum layer is present, wherein a value of 1 nm<dNb<1,000 nm is applicable for the thickness dNb of the niobium layer, while the thickness of the silicon layer is dSi=1−$e^{-k \cdot dNb}$ in μm with 0.001<k<0.005 in 1/nm where the niobium layer is present, and wherein a value of 1 nm<dMo<1,000 nm is applicable for the thickness dMo of the molybdenum layer, and wherein the thickness of the silicon layer is dSi=1−$e^{-k \cdot dMo}$ in μm with 0.001<k<0.005 in 1/nm, where the molybdenum layer is present.

55. An optical filter according to claim 51, wherein the filter has maximum dimensions of between 1 cm and 4 cm on the filter plane.

56. An optical filter, consisting of:

two silicon layers with one zirconium layer, niobium layer, or molybdenum layer interposed between the two silicon layers, wherein the optical filter is used in transmission of radiation in the extreme ultraviolet wavelength range and has a transmission of 50% or more for radiation of about 92 eV, and wherein a support structure is interposed between two or within one of the three layers.

57. An optical filter according to claim 56, wherein the silicon layers have a thickness of between 50 nm and 100 nm, while the zirconium, niobium or molybdenum layer has a thickness of between 10 nm and 40 nm.

58. An optical filter according to claim 57, wherein the support structure is a nickel mesh.

59. An optical filter according to claim 56, wherein the filter has maximum dimensions of between 8 cm and 14 cm on the filter plane.

* * * * *